(12) United States Patent
Li

(10) Patent No.: US 12,154,884 B2
(45) Date of Patent: *Nov. 26, 2024

(54) SEMICONDUCTOR PACKAGING METHOD, SEMICONDUCTOR ASSEMBLY AND ELECTRONIC DEVICE COMPRISING SEMICONDUCTOR ASSEMBLY

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

( * ) Notice: Subject to any disclaimer, the term of this patent is extended or adjusted under 35 U.S.C. 154(b) by 481 days.

This patent is subject to a terminal disclaimer.

(21) Appl. No.: 17/589,881

(22) Filed: Jan. 31, 2022

(65) Prior Publication Data

US 2022/0246576 A1    Aug. 4, 2022

Related U.S. Application Data

(63) Continuation-in-part of application No. 17/562,939, filed on Dec. 27, 2021.

(30) Foreign Application Priority Data

Feb. 1, 2021   (CN) .......................... 202110137354.0

(51) Int. Cl.
    *H01L 23/00*    (2006.01)
    *H01L 25/065*   (2023.01)
    *H01L 25/10*    (2006.01)

(52) U.S. Cl.
    CPC .............. *H01L 24/81* (2013.01); *H01L 24/19* (2013.01); *H01L 24/29* (2013.01);
    (Continued)

(58) Field of Classification Search
    CPC ..................... H01L 24/81; H01L 24/19; H01L 2224/11005; H01L 2224/16104; H01L 2224/17104; H01L 2224/19
    See application file for complete search history.

(56) References Cited

U.S. PATENT DOCUMENTS 5,399,898 A    3/1995 Rostoker
5,600,180 A    2/1997 Kusaka
(Continued)

FOREIGN PATENT DOCUMENTS

CN    1949499 A    4/2007
CN    102148173 A    8/2011
(Continued)

OTHER PUBLICATIONS

Shanghai Yibu Semiconductor Co., Ltd., English Translation of KR First Office Action, KR 10-2022-0074762, Mar. 28, 2023, 7 pgs.
(Continued)

*Primary Examiner* — Mohammad M Choudhry
(74) *Attorney, Agent, or Firm* — USCH Law, PC

(57) ABSTRACT

A semiconductor packaging method, a semiconductor assembly and an electronic device are disclosed herein. The semiconductor packaging method comprises forming a first-stage assembly, including: align and fix at least one first-stage device to a target position on a carrier plate by utilizing the self-alignment capability of first-stage alignment solder joints; and while using a clamping board to support an exposed side of the at least one first-stage device, performing injection molding through an opening in the carrier board or the clamping board. The packaging method further comprises align and fix a second-stage device to a target position on the first-stage assembly by utilizing the self-alignment capability of second-level alignment solder joints between the first-stage assembly and the second-stage device. The packaging method improves the operation speed (Continued)

and accuracy of the picking and placing of the first-stage device and the second-stage device, resulting in improved process efficiency and reduced process cost.

20 Claims, 12 Drawing Sheets

(52) U.S. Cl.
CPC ........ *H01L 25/0655* (2013.01); *H01L 25/105* (2013.01); *H01L 2224/11005* (2013.01); *H01L 2224/16104* (2013.01); *H01L 2224/17104* (2013.01); *H01L 2224/19* (2013.01); *H01L 2224/8112* (2013.01)

(56) References Cited

U.S. PATENT DOCUMENTS

| | | |
|---|---|---|
| 6,809,421 B1 | 10/2004 | Hayasaka |
| 7,446,419 B1 | 11/2008 | Lin |
| 10,504,826 B1 | 12/2019 | Fillion |
| 10,847,435 B2 | 11/2020 | Kim et al. |
| 2003/0000738 A1 | 1/2003 | Rumsey |
| 2003/0062631 A1 | 4/2003 | Nemoto |
| 2004/0262774 A1 | 12/2004 | Kang |
| 2006/0177965 A1 | 8/2006 | Senda |
| 2007/0126111 A1 | 6/2007 | Mirsky |
| 2007/0205520 A1 | 9/2007 | Chou et al. |
| 2008/0284408 A1 | 11/2008 | Kunst et al. |
| 2009/0039526 A1 | 2/2009 | Wang |
| 2009/0057866 A1 | 3/2009 | Chow |
| 2009/0130838 A1 | 5/2009 | Sakaguchi |
| 2011/0071397 A1 | 3/2011 | Wodnicki |
| 2011/0074004 A1 | 3/2011 | Shen |
| 2012/0032321 A1 | 2/2012 | West |
| 2012/0146216 A1 | 6/2012 | Kang |
| 2013/0059416 A1 | 3/2013 | Liu et al. |
| 2013/0234317 A1 | 9/2013 | Chen |
| 2013/0244382 A1 | 9/2013 | Clark |
| 2013/0248237 A1 | 9/2013 | Zhou |
| 2013/0292843 A1 | 11/2013 | Lee |
| 2015/0255415 A1 | 9/2015 | De Bonis |
| 2017/0025387 A1 | 1/2017 | Ichikawa |
| 2017/0358554 A1 | 12/2017 | Chen et al. |
| 2019/0103375 A1 | 4/2019 | Huang |
| 2020/0006241 A1 | 1/2020 | Wu |
| 2020/0075437 A1* | 3/2020 | Nozu ............... H01L 33/483 |
| 2020/0161183 A1 | 5/2020 | Lai et al. |
| 2020/0321234 A1 | 10/2020 | Choi |
| 2020/0365547 A1 | 11/2020 | Yang |

FOREIGN PATENT DOCUMENTS

| | | |
|---|---|---|
| CN | 102194718 A | 9/2011 |
| CN | 103295991 A | 9/2013 |
| CN | 103890933 A | 6/2014 |
| CN | 103915355 A | 7/2014 |
| CN | 104037153 A | 9/2014 |
| CN | 104380465 A | 2/2015 |
| CN | 104505351 A | 4/2015 |
| CN | 102983087 B | 6/2015 |
| CN | 105244341 A | 1/2016 |
| CN | 105448862 A | 3/2016 |
| CN | 108028239 A | 5/2018 |
| CN | 109585312 A | 4/2019 |
| CN | 112018047 A | 12/2020 |
| CN | 202103249 A | 1/2021 |
| JP | 06112463 A | 4/1994 |
| JP | H06112463 A | 11/1999 |
| JP | H11317468 A | 11/1999 |
| JP | 2004253598 A | 9/2004 |
| JP | 2005236232 A | 9/2005 |
| JP | 2007189066 A | 7/2007 |
| JP | 2007329503 A | 12/2007 |
| JP | 2008171879 A | 7/2008 |
| JP | 2011071259 A | 4/2011 |
| KR | 20140070602 A | 6/2014 |
| KR | 20170026170 A | 2/2019 |
| TW | 521411 B | 2/2003 |
| TW | 200531234 A | 9/2005 |
| TW | 201032307 A | 9/2010 |
| TW | 201225193 A | 6/2012 |
| TW | M507066 U | 8/2015 |
| TW | 201642360 A | 12/2016 |
| TW | I578421 B | 4/2017 |
| TW | I605526 B | 11/2017 |
| TW | 201917835 A | 5/2019 |
| TW | 201921620 A | 6/2019 |
| TW | 202101635 A | 1/2021 |
| TW | 202133279 A | 9/2021 |

OTHER PUBLICATIONS

Shanghai Yibu Semiconductor Co., Ltd., KR First Office Action with English Translation, KR 10-2021-01640040, Mar. 29, 2023, 11 pgs.
Shanghai Yibu Semiconductor Co., Ltd., KR Second Office Action with English Translation, KR 10-2021-01640040, Nov. 26, 2023, 13 pgs.
Shanghai Yibu Semiconductor Co., Ltd., KR First Office Action with English Translation, KR 10-2021-0164048, Nov. 6, 2023, 11 pgs.
Weiping Li, U.S. Appl. No. 17/535,983, Non-Final Office Action issued Jun. 30, 2023.
Weiping Li, U.S. Appl. No. 17/535,986, Non-Final Office Action issued Jul. 20, 2023.
Weiping Li, U.S. Appl. No. 17/568,293, Non-Final Office Action issued Jul. 17, 2023.
Weiping Li, U.S. Appl. No. 17/568,293, Final Office Action issued Dec. 20, 2023.
Yibu Semiconductor (Shanghai) Co., Ltd., First Office Action, CN 202011573447.X, Mar. 1, 2022, 11 pgs.
Yibu Semiconductor (Shanghai) Co., Ltd., Notice of reexamination, CN 202011573447.X, Apr. 18, 2023, 9 pgs.
Yibu Semiconductor (Shanghai) Co., Ltd., Search Report, TW 110147931, Jul. 19, 2022, 1 pg.
Yibu Semiconductor (Shanghai) Co., Ltd., First Office Action , TW 110147931, Jul. 19, 2022, 2 pgs.
Yibu Semiconductor (Shanghai) Co., Ltd., Second Office Action, TW 110147931, Oct. 17, 2022, 2 pgs.
Yibu Semiconductor (Shanghai) Co., Ltd., First Office Action, CN 202011559060.9, Jun. 30, 2023, 6 pgs.
Yibu Semiconductor (Shanghai) Co., Ltd., Search Report, TW 110147932, Nov. 18, 2022, 1 pg.
Yibu Semiconductor (Shanghai) Co., Ltd., First Office Action, TW 110147932, Nov. 18, 2022, 2 pgs.
Yibu Semiconductor (Shanghai) Co., Ltd., First Office Action, CN 202110062475.3, Jul. 8, 2023, 17 pgs.
Yibu Semiconductor (Shanghai) Co., Ltd., Notice of reexamination, CN 202110062475.3, Dec. 19, 2023, 13 pgs.
Yibu Semiconductor (Shanghai) Co., Ltd., Search Report, TW 111101834, Sep. 30, 2022, 1 pg.
Yibu Semiconductor (Shanghai) Co., Ltd., First Office Action, TW 111101834, Sep. 30, 2022, 33 pgs.
Yibu Semiconductor (Shanghai) Co., Ltd., First Office Action, CN 202110137354.0, Jun. 29, 2023, 8 pgs.
Yibu Semiconductor (Shanghai) Co., Ltd., First Office Action, TW 111102528, Aug. 5, 2022, 2 pgs.
Yibu Semiconductor (Shanghai) Co., Ltd., Search Report, TW 111102528, Aug. 5, 2022, 2 pgs.
Yibu Semiconductor (Shanghai) Co., Ltd., First Office Action, TW 111104536, Aug. 25, 2022, 11 pgs.
Yibu Semiconductor (Shanghai) Co., Ltd., Second Office Action, TW 111104536, Apr. 11, 2023, 10 pgs.
Weiping Li, U.S. Appl. No. 17/535,986, Response to Non-Final Office Action filed Oct. 20, 2023.

(56) References Cited

OTHER PUBLICATIONS

Weiping Li, U.S. Appl. No. 17/535,986, Notice of Allowance issued Feb. 13, 2024.
Weiping Li, U.S. Appl. No. 17/562,944, Non-Final Office Action, issued Apr. 11, 2024.

* cited by examiner

300

S310 — Providing at least one first-stage device, at least one second-stage device, a carrier board, and a clamping board, the at least one first-stage device having first-stage first surface formed with first-stage interconnect pads and opposing first-stage second surface formed with first-stage first alignment solder parts, the at least one second-stage device having second-stage first surface formed with second-stage interconnect terminals and second-stage first alignment solder parts, the carrier board having first-stage second alignment solder parts formed thereon, at least one of the carrier board and the clamping board having at least one opening S320 — Placing the at least one first-stage device on the carrier board such that the first alignment solder parts are substantially aligned with respective ones of the second alignment solder parts S330 — Forming alignment solder joints by soldering the first-stage first alignment solder parts to respective ones of the first-stage second alignment solder parts to align and fix the at least one first-stage device to the carrier board S340 — Injecting a molding compound through the at least one opening to form a molded package body encapsulating the at least one first-stage device between the carrier board and the clamping board abutting the first surface of the at least one first-stage device S350 — Removing the clamping board to expose the first-stage first surface S360 — Sequentially forming an interconnect layer and interposer terminals corresponding to the second-stage interconnect terminals on a side of the molded package body where the first-stage first surface is exposed such that at least some of the first-stage interconnect pads are respectively electrically connected to the interposer terminals, through the interconnect layer S360a — Forming second-stage second alignment solder parts corresponding to the second-stage first alignment solder parts, respectively, on the interconnect layer, resulting in a first-stage assembly To S370

FIG. 3A

SEMICONDUCTOR PACKAGING METHOD, SEMICONDUCTOR ASSEMBLY AND ELECTRONIC DEVICE COMPRISING SEMICONDUCTOR ASSEMBLY

CROSS REFERENCE TO RELATED APPLICATIONS

This application claims the benefit of priority under the Paris Convention to Chinese Patent Application No. CN202110137354.0, filed Feb. 1, 2021, entitled "Semiconductor Packaging Method, Semiconductor Assembly and Electronic Device Comprising Semiconductor Assembly," and is a continuation-in-part application of U.S. patent application Ser. No. 17/562,939, filed Dec. 27, 2021, which claims the benefit of priority under the Paris Convention to Chinese Patent Application No. 202011559060.9, filed Dec. 25, 2020, entitled "Semiconductor Packaging Method, Semiconductor Assembly and Electronic Device Comprising Semiconductor Assembly," and Chinese Patent Application No. 202011573447.X, filed Dec. 25, 2020, entitled "Semiconductor Packaging Method, Semiconductor Assembly and Electronic Device Comprising Semiconductor Assembly," each of which is incorporated by reference herein in its entirety. This application is related to co-pending U.S. patent application Ser. No. 17/535,983, filed Nov. 26, 2021, U.S. patent application Ser. No. 17/535,986, filed Nov. 26, 2021, and U.S. patent application Ser. No. 17/562,944, entitled "Semiconductor Packaging Method, Semiconductor Assembly and Electronic Device Comprising Semiconductor Assembly," filed Dec. 27, 2021, each of which is incorporated by reference herein in its entirety.

FIELD OF THE INVENTION

The present application relates to the technical field of semiconductor manufacturing, in particular to a semiconductor packaging method, a semiconductor assembly and electronic device comprising the semiconductor assembly.

BACKGROUND

Semiconductor packages and systems that are compact, small, lightweight, and thin in design, while at the same time achieving high integration and versatility in function, are constantly being sought. Currently, various packaging technologies are proposed to meet the above-mentioned technical requirements, such as fan-out wafer level packaging, small chip packaging (chipset), heterogeneous integration, and 2.5-dimensional (2.5D) or three-dimensional (3D) packaging. These packaging techniques have different advantages and characteristics, but all present some technical challenges. Taking the existing fan-out package as an example, it faces many technical problems, such as warpage (warp), chip shift (die shift), surface flatness (topography), non-coplanarity between the chip and the molded package body (chip-to-mold non-planarity), package reliability (reliability), etc. Despite the continuing efforts in the industry to improve these technical problems by improving the equipment, materials, process elements, there is no economical and effective solution to some of the technical problems, especially problems such as warpage, chip drift, and surface coplanarity between different chips.

In addition, there are common techniques involved in the fabrication of various high-end semiconductor packages and systems, often involving the placement and attachment of semiconductor devices with high precision. This process step is usually performed by a high precision mounting (pick and place or die binder) equipment, which is very expensive. Still, the mounting speed is limited, resulting in low production speed, which becomes a bottleneck for the development and popularization of the technology.

The present application includes some embodiments directed to solving several of the core technical problems set forth above.

SUMMARY

Certain embodiments are directed to a novel semiconductor packaging method, semiconductor device and electronic device including the semiconductor device, which at least solve the above and other problems in existing semiconductor packaging technologies.

A semiconductor packaging method in accordance with some embodiments comprises forming a first stage assembly, including providing at least one first-stage device, at least one second-stage device, a carrier board, and a clamping board. In some embodiments, each of the at least one first-stage device respectively has a first-stage first surface and an opposing first-stage second surface, the first-stage first surface is formed with first-stage interconnect pads, the first-stage second surface is formed with first-stage first alignment solder parts, each of the at least one second-stage device respectively has a second-stage first surface, the second-stage first surface is formed with second-stage interconnect terminals and second-stage first alignment solder parts, and the carrier board is formed with first-stage second alignment solder parts respectively corresponding to the first-stage first alignment solder parts, and wherein at least one of the carrier board and the clamping board has at least one opening.

In some embodiments, forming the first stage assembly further includes: placing the at least one first-stage device on the carrier board such that the first alignment solder parts are substantially aligned with respective ones of the second alignment solder parts; and forming alignment solder joints by soldering the first alignment solder parts to respective ones of the second alignment solder parts to align and fix the at least one first-stage device to the carrier board.

In some embodiments, forming the first stage assembly further includes injecting a molding compound through the at least one opening to form a molded package body encapsulating the at least one first-stage device between the carrier board and the clamping board abutting the first surface of the at least one first-stage device.

In some embodiments, forming the first stage assembly further includes: removing the clamping board to expose the first-stage first surface; sequentially forming an interconnect layer and interposer terminals corresponding to the second-stage interconnect terminals on a side of the molded package body where the first-stage first surface is exposed such that at least some of the first-stage interconnect pads are respectively electrically connected to the interposer terminals, through the interconnect layer; and forming second-stage second alignment solder parts corresponding to the second-stage first alignment solder parts, respectively, on the interconnect layer.

In some embodiments, after forming the first-stage assembly, the packaging method further comprises: placing the at least one second-stage device over the interconnect layer such that the second-stage first alignment solder parts are substantially aligned with the second-stage second alignment solder parts; forming second-stage alignment solder joints by soldering the second-stage first alignment solder parts and the second-stage second alignment solder parts so that the at least one second-stage device is precisely aligned to the first-stage assembly; pressing the at least one second-stage device and the first-stage assembly toward each other while the second-stage alignment solder joints are at least partially melted to respectively join the second-stage interconnection terminals and the interposer terminals to form interconnect joints; and releasing the pressing.

In some embodiments, the at least one first-stage device and the at least one second-stage device includes at least one of one or more semiconductor devices and an interconnect board, the interconnect board being a interposer or a substrate.

In some embodiments, at least one of the at least one first-stage device and the at least one second-stage device further includes a through electrode.

In some embodiments, a sum of heights of a second-stage interconnect terminal and a corresponding interposer terminal is less than a sum of heights of a second-stage first alignment solder part and a corresponding second-stage second alignment solder part, such that the second-stage interconnect terminals are spaced apart from the interposer terminals after the second-stage first alignment solder parts and the second-stage second alignment solder parts form second-stage alignment solder joints.

In some embodiments, the semiconductor packaging method further comprises forming external interconnect terminals on the interconnect layer such that at least some of the first-stage interconnect pads are respectively electrically connected to the external interconnect terminals through the interconnect layer. In some embodiments, the plurality of external interconnect terminals are spaced apart from the second level second alignment solder parts so as not to be covered by a perpendicular projection of the at least one second-stage device on the interconnect layer after at least one second-stage device is precisely aligned with the first-stage assembly.

In some embodiments, respectively joining the second-stage interconnection terminals and the interposer terminals to form interconnect joints includes, while the at least one second-stage device is in precise alignment with the first-stage assembly and the second-stage alignment solder joints are still in an at least partially molten state, pressing the at least one second-stage device and the first-stage assembly toward each other.

In some embodiments, respectively joining the second-stage interconnection terminals and the interposer terminals to form interconnect joints includes, after the at least one second-stage device is in precise alignment with the first-stage assembly, applying heat to melt the second-stage alignment solder joints again and pressing the at least one second-stage device and the first-stage assembly toward each other when the second-stage alignment solder joints are in a molten or partially molten state.

In some embodiments, the second-stage interconnect terminals are interconnect bumps, and the interposer terminals are interposer bumps or interposer pads.

In some embodiments, the second-stage interconnect terminals are interconnect pads and the interposer terminals are interposer bumps.

In some embodiments, the interconnect bumps are solder bumps and respectively joining the second-stage interconnect terminals and the interposer terminals includes soldering the second-stage interconnect terminals to respective ones of the interposer terminals to form interconnect joints.

In some embodiments, the interconnect bumps does not include solder and respectively joining the second-stage interconnect terminals and the interposer terminals includes bonding the second-stage interconnect terminals and respective ones of the interposer terminals by thermocompression bonding.

In some embodiments, forming the first-stage assembly does not include forming the interconnect layer, and the second-stage second alignment solder parts are pre-formed on a side of the first-stage assembly where the first-stage first surface is exposed and respectively correspond with the second-stage first alignment solder parts. In such case, the packaging method further comprises, after forming the first-stage assembly: placing the at least one second-stage device on the first-stage assembly such that the second-stage first alignment solder parts are substantially aligned with second-stage second alignment solder parts on the first-stage assembly; forming second-stage alignment solder joints by soldering the second-stage first alignment solder parts and the second-stage second alignment solder parts so that the at least one second-stage device is precisely aligned to the first-stage assembly; pressing the at least one second-stage device and the first-stage assembly toward each other while the second-stage alignment solder joints are at least partially melted to respectively join the second-stage interconnection bumps and the corresponding first-stage interconnect pads to form interconnect joints; and releasing the pressing.

In some embodiments, the second-stage interconnect bumps are respectively joined with the first stage interconnect pads by soldering the second-stage interconnect bumps to respective ones of the first-stage interconnect pad.

In some embodiments, the second-stage interconnect bumps are respectively joined with the first stage interconnect pads by thermocompression bonding.

In some embodiments, the second-stage interconnect bumps and the second-stage first alignment solder parts together serve as second-stage interconnect terminals on the second-stage first surface of the at least one second-stage device, the second-stage interconnect terminals corresponding, respectively, with the first-stage interconnect pads on the at least one first-stage device.

In some embodiments, in the case that the first-stage assembly does not include the interconnect layer, the packaging method further comprises, after removing the clamping board and before placing the second-stage device on the first-stage assembly, forming the second-stage alignment solder parts on a side of the first-stage assembly where the first-stage first surface is exposed.

Another aspect of the present application provides a semiconductor device packaged by the above semiconductor packaging method.

Yet another aspect of the present application provides an electronic device including the semiconductor device described above.

In some embodiments, above description is only an overview of the present application so that the technical solutions of the present application can be more clearly understood and implemented according to the contents of the specification. In order to make the aforementioned and other objects, features and advantages of the present application more comprehensible, embodiments of the present application are described in detail below.

BRIEF DESCRIPTION OF THE DRAWINGS

The present embodiments are illustrated by way of example and not limitation in the figures of the accompanying drawings, in which like references indicate similar elements.

FIGS. 3A-3B show a flow chart illustrating a packaging method according to some embodiments.

DETAILED DESCRIPTION OF THE EMBODIMENTS

Figure 1:
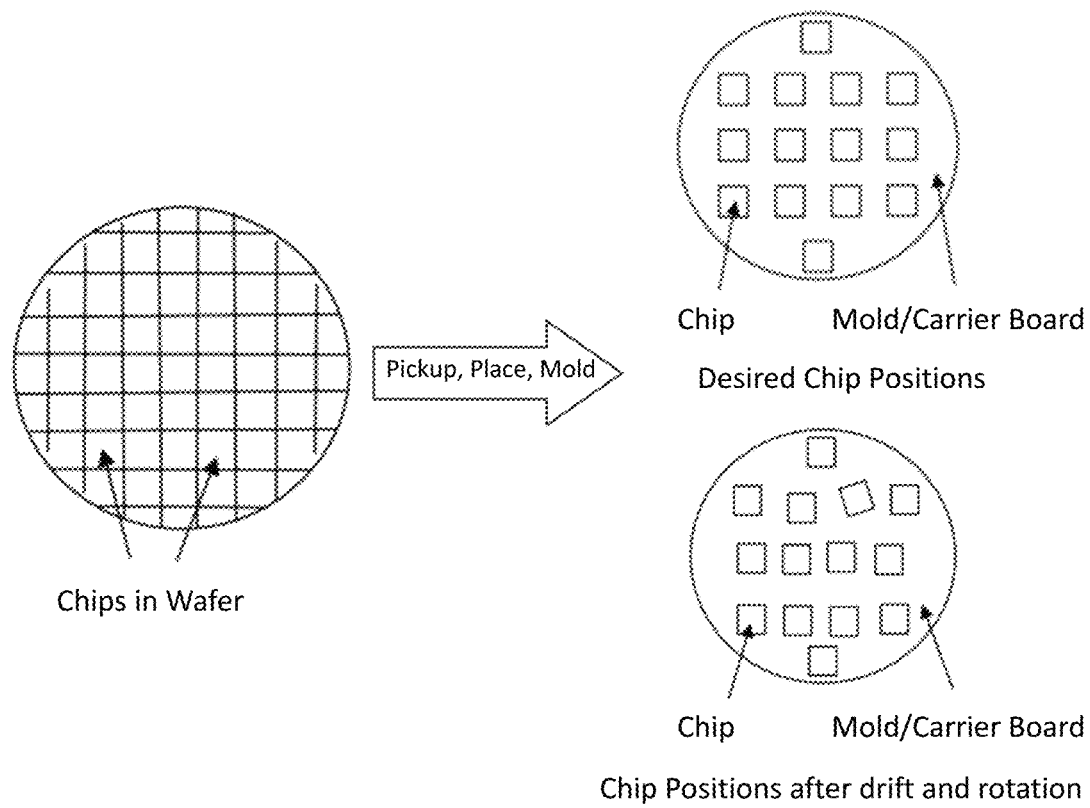
FIG. 1 is a schematic diagram illustrating a chip drift and a chip rotation phenomenon caused by a placement misalignment or a mold flow (mold flow) push during a chip-on-chip (chip-first) fan-out type package according to the related art.

The present application is intended in the following description to include at least one embodiment with reference to the accompanying drawings, in which like numerals represent the same or similar elements. Although the following description is based primarily on specific embodiments, it should be understood by those skilled in the art that the following description is intended to cover alternatives, modifications, and equivalents, which may be included within the spirit and scope of the present invention as defined by the appended claims and their equivalents, and as supported by the following description and drawings. In the following description, certain specific details are set forth, such as specific configurations, compositions, and processes, etc., to provide a thorough understanding of the present application. In other instances, well-known process and manufacturing techniques have not been described in detail to avoid unnecessarily obscuring the present application. Furthermore, the various embodiments shown in the figures are schematic representations and are not necessarily drawn to scale.

Semiconductor components (which may also be referred to as semiconductor packages) are a core component of modern electronic devices or products. Semiconductor components can be broadly classified in terms of device number and density into: discrete semiconductor devices, i.e., single chip devices, such as a single digital logic processor, diode, transistor; multi-chip components, such as a module of image sensors (CIS) and image processors (ASIC), a stack of a Central Processing Unit (CPU) and a dynamic memory (DRAM); and system level components, such as radio frequency Front End Modules (FEMs) in cell phones, display screen modules in cell phones and smart watches. Generally, the system-level package can include a wide variety of devices, including passive components (resistors, capacitors, inductors) and other devices or even components, in addition to semiconductor devices.

The semiconductor components herein may include active and passive devices including, but not limited to, active devices such as bipolar transistors, field effect transistors, integrated circuits, and passive devices such as chip resistors, capacitors, inductors, Integrated Passive Devices (IPDs), micro-electro-mechanical systems (MEMS), and the like. Various electrical connections are established between various active and passive devices to form circuits that enable the semiconductor assembly to perform high speed calculations and other useful functions.

Currently, semiconductor manufacturing typically involves two complex manufacturing processes, namely front-end wafer fabrication and back-end packaging, each of which may involve hundreds of steps. Previous wafer fabrication involves forming a plurality of chips (die) on the surface of the wafer. Each chip is generally identical and contains internally the circuits formed by the electrical connections of the active and/or passive elements. Subsequent packaging involves separating individual chips from the finished wafer and packaging them into semiconductor assemblies to provide electrical connections, structural support, heat dissipation, and environmental isolation, while facilitating subsequent assembly of the electronic product.

An important goal of semiconductor manufacturing is to produce smaller semiconductor devices, packages, and assemblies. Smaller sizes, generally higher integration, less power consumption, higher performance, and smaller area/volume, are important to the performance of the final product. In one aspect, wafer fabrication can be improved to shrink chip sizes, increase circuit density and/or improve performance. In another aspect, subsequent packaging can be improved to further reduce the sizes, increase the density, and improve the performance of the semiconductor assembly by improving the packaging design, process and packaging material.

In the back-end packaging process, a novel and efficient packaging method is the so-called fan-out packaging. Fan-out packaging is a packaging technique that wraps single or multiple qualified chips (die) from a diced wafer with a molding compound and routes interconnect traces from the chip's interconnect pads to external solder balls via a redistribution layer (RDL) to achieve higher I/O density and flexible integration. The fan-out type package may be mainly classified into a chip-first type package and a chip-last type package. Chip-first type packages can be classified into a face-down type and a face-up type.

The chip-first/face-down type packaging mainstream process comprises the following main steps: picking up chips from the cut wafer and placing the chips on a carrier board pasted with an adhesive film so that an first surface of the chips faces the adhesive film; encapsulating the chips using a molding compound; removing the carrier board (together with the adhesive film) to expose the first surface of the chip; forming an interconnect layer (including an RDL layer and Under Bump Metallization (UBM)) on an first surface of a chip; forming solder balls on the interconnect layer. The interconnect pads or the interconnect bumps of the chip are electrically connected with the solder balls through the interconnect layer; and dicing to form individual semiconductor elements.

The chip-first/face-up type packaging process and the chip-first/face-down type packaging process can be approximately the same, and the main difference is as follows: picking up a chip and placing the chip on a carrier board pasted with an adhesive film. The first surface of the chip is opposite to (or facing away from) the adhesive film; thinning the molded package body on one side of the first surface of the chip after encapsulation to expose the interconnect bumps on the first surface of the chip; and the carrier board may be removed after the formation of the interconnect layer and the solder balls.

Figure 2:
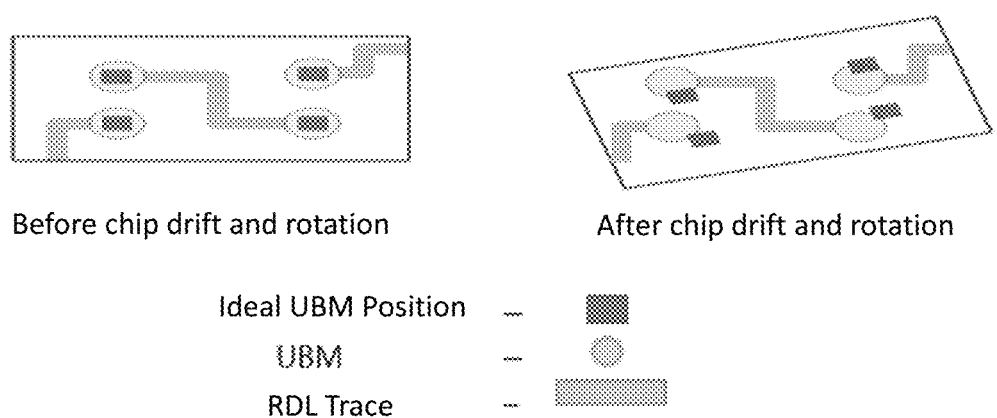
FIG. 2 shows a state diagram of Under Bump Metallization (UBM) and redistribution layer (RDL) trace position mismatch (or misalignment) formed after chip drift and rotation as shown in FIG. 1.

In the technical problem faced by the fan-out package at present, the high-precision placement and position fixing of the chip still lack an efficient and economical method. The higher the chip placement accuracy, the higher the equipment cost, the lower the production efficiency, and the more difficulty in breaking through the 0.5 micron limit of the chip mounting equipment. In addition, after a chip is placed on the adhesive film, which is used for bonding and fixing the chip, the flowing of the molding material can push the chip in the encapsulation process, so that the chip can be displaced and rotated on the adhesive film due to the deformability of the adhesive film. The higher temperatures used in the molding or encapsulation process further exacerbate this problem. Another source of chip displacement and rotation is internal stresses within the molded structure (the structure in which the chip and carrier are encapsulated d in a molding compound). Specifically, in the existing chip-first/face-down type packaging process, the encapsulation process comprises three stages: heating and injection molding, partial curing of a encapsulation material in high-temperature, and cooling, which are usually followed by a constant temperature heating step to fully cure the molding compound. The thermal expansion coefficients of the chip, the molding compound, the adhesive film, the carrier board, and the like are different, so the mismatch of the thermal expansion coefficients of various materials and the curing shrinkage of the molding compound in the encapsulation process cause uneven internal stress of the molding compound, which further causes chip drift and/or rotation (as shown in the chip arrangement at the lower right of FIG. 1) and warpage of the molded package body. Chip drift and/or rotation in turn causes positional mismatch or misalignment of subsequently formed RDL traces and UBMs (as shown in FIG. 2), which can result in a significant yield drop. The warpage of the molded package body causes difficulties in subsequent packaging processes including Under Bump Metallization (UBM) and redistribution line (RDL), and in severe cases even make it impossible to continue the process.

In addition, in the back-end packaging process, it may be necessary to further implement interconnection integration of a substrate (e.g., in a system-in-package), an interposer (e.g., in a 2.5D package), or another layer of chips (e.g., in a 3D package) in the Z-axis direction on the basis of two-dimensional integration of an X-Y plane (e.g., a plane parallel to an first surface or a second surface of a chip) according to specific package specifications. At this time, similarly to the fan-out package described above, at least the high-precision placement and position fixing of the upper device on the lower device lacks an efficient and economical method. In addition, as for the interconnection between upper and lower devices in a 3D package (e.g., integrated fo (integrated fan out), CoWoS (chip on wafer on substrate), SoIC (system integrated chip)), a key technology that is currently mainstream is hybrid bonding (hybrid bonding). However, the hybrid bonding has many technical difficulties, and besides the common problems of high cost and low production efficiency, there are many other problems, such as that the Chemical Mechanical Polishing (CMP) is difficult to meet the strict requirement for pad dishing, the pad density difference of different areas on the chip affects the depth of the dishing, the pad (metal copper) is easy to oxidize at high temperature, and the chip is easy to be contaminated in the hybrid bonding of the chip and the wafer (die-to-wafer).

The present application aims to provide a novel and breakthrough packaging method that can at least solve the above technical problems.

A packaging method according to some embodiments utilizes self-alignment capability of alignment solder joints between a first-stage device and a carrier board in a molten or partially molten state of solder to automatically and precisely align the first-stage device to a target position on the carrier board and fix the position the first-stage device after the solder is solidified. In some embodiments, first-stage first alignment solder parts are pre-formed on a first-stage second surface (i.e. the opposite surface of a first-stage first surface with interconnect terminals, which can be interconnect or contact pad, or interconnect or contact bumps) of the first-stage device, and corresponding first-stage second alignment solder parts are formed on the carrier board. For example, one of a first-stage first alignment solder part and a corresponding first-stage second alignment solder part can be a solder bump, while the other of the first-stage first alignment solder part and the corresponding first-stage second alignment solder part can be a solder pad or solder bump. In some embodiments, after placing the first-stage device at the target position on the carrier board by aligning the first-stage first alignment solder parts and the first-stage second alignment solder parts with each other, one (or both) of each respective first-stage first alignment solder part and its corresponding first-stage second alignment solder part are melted to form a respective alignment solder joint. At this point, if the first-stage device is not precisely aligned to the target position on the carrier board (i.e., the first-stage first alignment solder part and the corresponding first-stage second alignment solder part are not aligned), the alignment solder joint in a molten or partially molten (liquid or partially liquid) state should automatically and precisely guides the first-stage device to the target position to achieve surface energy minimization according to the principle of minimum surface energy, and the fused alignment solder joint keeps the first-stage device firmly fixed at the target position after solidification. The first-stage first and second alignment solder parts are optimally designed (in terms including but not limited to volume, geometry, composition, location, distribution, and number, etc.) to enable the accurate, efficient, and reliable self-alignment capability. Fixing the first-stage device on the carrier board by adopting the soldering technique instead of the adhesive film bonding technique leads to many advantages. For example, any warping problem is improved, any possible drifting and rotating problems of the first-stage device in the encapsulation process are prevented by the firm soldering joints, placing deviation of a certain degree can be allowed when the first-stage device is picked up and placed in view of the self-aligning capacity of the alignment solder joint, the requirement on the placing precision of the first-stage device (especially for pick and place or die bonder) can be obviously reduced, the picking and placing operation speed of the semiconductor device can be obviously improved, the process efficiency is improved, and the process cost is reduced.

Secondly, according to some embodiments, the carrier plate is used for supporting one side of the first-stage device, e.g., the first-stage second surface of the first-stage device, while a clamping board is utilized to abut against the first-stage first surface of the first-stage device, and the molded packaging process is realized by performing injection molding through an opening in the carrier board supporting the side of the first-stage second surface of the first-stage device, or through an opening in the clamping board. Thus, compared with existing chip-first/face-up type packaging process, the molded packaging body does not need to be thinned (by, for example, grinding) or drilled to expose the interconnect bumps or the interconnect pads after the molding or encapsulation process is performed, the efficiency of the molding or encapsulation process can be improved, accidental damage to the first-stage first surface of the first-stage device caused by thinning (for example, grinding) or drilling processes can be avoided, and the yield can be improved.

Secondly, according to the packaging method of the embodiment of the application, the carrier board is used for supporting one side of the first-stage second surface of the first-stage device, the clamping board is used for propping against the first-stage first surface of the first-stage device, and meanwhile, a molding process is realized by injection molding through the opening of the carrier board or the clamping board, so that compared with the existing chip-first/face-up type packaging process, the molded package body does not need to be drilled after the molding process is performed so as to expose the interconnection bonding pads, or only needs to be slightly cleaned (for example, plasma cleaning) after the molding process is performed so as to clean the surfaces of the interconnection bonding pads, so that the efficiency of the molding process can be improved, and the accidental damage of the first-stage first surface of the first-stage device caused by the processes of thinning (for example, grinding) or drilling and the like can be avoided, and the.

In addition, according to the packaging method of the embodiment of the application, when the Z-axis direction interconnection integration of the second-stage device (an interconnection board (e.g. a substrate or an interposer) or a semiconductor device) is carried out on the first-stage assembly comprising the first-stage device, the self-alignment capability of the second-stage alignment solder spots between the first-stage device and the interconnection board in the state that the soldering tin is at least partially melted is also utilized to automatically and accurately align the second-stage device to the target position on the first-stage assembly and achieve the position fixing of the second-stage device after the soldering tin is solidified. In some embodiments, a second-stage first alignment solder part and a corresponding second-stage second alignment solder part are pre-formed on the second-stage first surface of the second-stage device and the corresponding surface of the first-stage assembly, respectively (e.g., one of the second-stage alignment solder bumps and the other of the second-stage alignment bond pads, or both). Similarly, a certain degree of placement deviation can be tolerated when picking and stacking the second-stage device on the first-stage assembly in view of the self-alignment capability of the second-stage alignment solder joints, so that the requirement for second-stage device placement accuracy (especially for chip and place (die bonder)) can be significantly reduced, and the speed of the second-stage device picking and placing operation can be significantly increased, thereby further improving process efficiency and reducing process cost. In addition, by replacing a hybrid bonding mode, the technical difficulties in hybrid bonding can be avoided, and simple, convenient, and efficient 3D packaging is realized.

As used herein, the term "semiconductor device" (e.g., first-stage device or second-stage device) may refer to a chip (also interchangeably referred to as die, integrated circuit) produced by a chip factory (fab), i.e., a chip that has not been packaged after wafer dicing and testing, and which may typically have only interconnect pads (pads) for external connection. The semiconductor device may also be a pre-processed (at least partially packaged) chip, such as a chip with interconnect bumps (bump) formed on the interconnect pads, or may have additional structures, such as stacked chips and packaged chips, as desired.

The term "first surface" or "active surface" as used herein generally refers to a surface on a front side of a semiconductor device having a circuit function, including interconnect pads (or interconnect bumps formed on the interconnect pads) thereon, and may also be interchangeably referred to as a front surface or a functional surface. A surface having no circuit function on an opposing back side of the semiconductor device may be interchangeably referred to as a second surface or a back surface.

The term "interconnect terminal" as used herein generally refers to an interconnect pad or an interconnect bump on the first surface of a semiconductor device.

The term "alignment solder part" as used herein generally refers to a structure that may be aligned and soldered to a corresponding other alignment solder part for alignment by soldering methods known in the art.

Figure 3B:
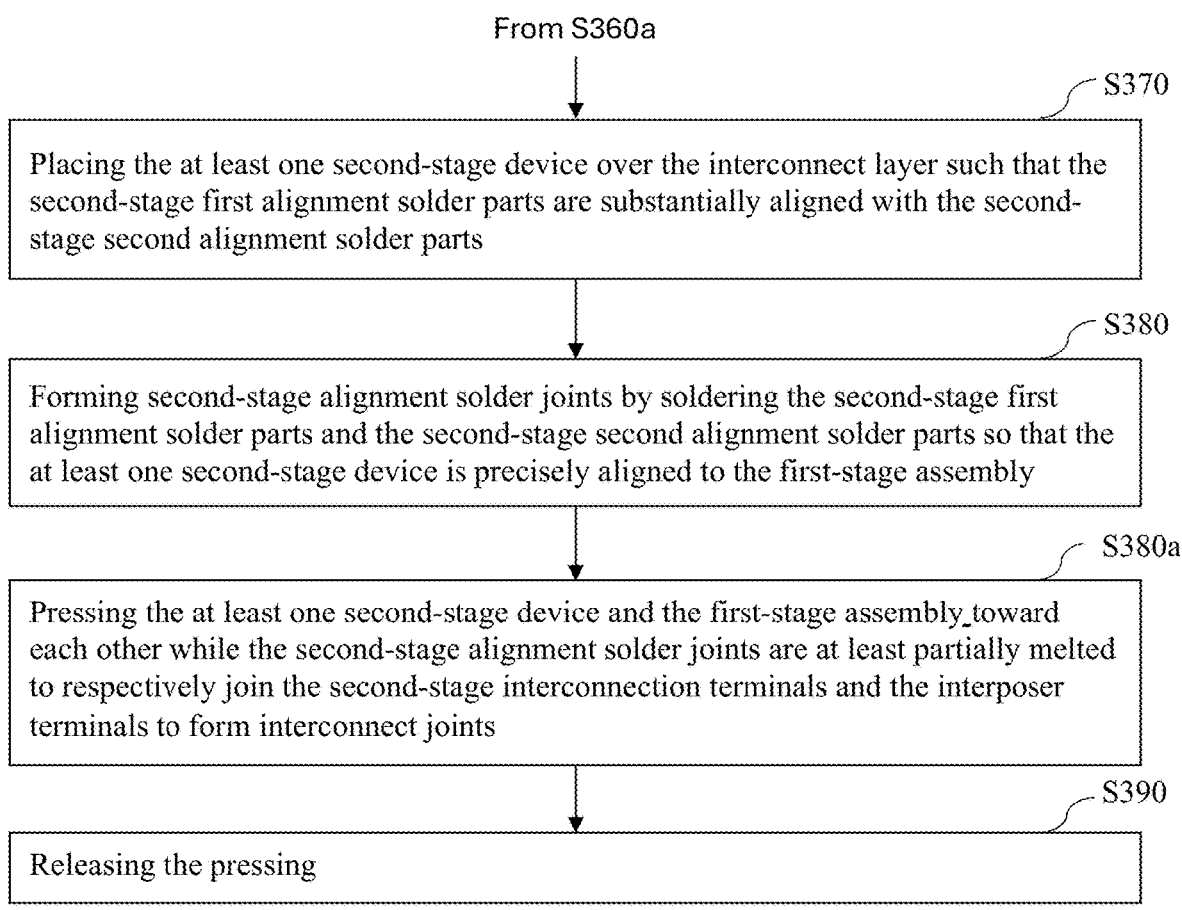

FIGS. 3A-3B show a schematic flow diagram of a packaging method 300 according to an embodiment of the present application. As shown, the packaging method 300 includes steps S310-S390, as described below.

S310—providing at least one first-stage (or first-level) device, at least one second-stage (or second-level) device, a carrier board, and a clamping board. In some embodiments, the first-stage device respectively has a first-stage first surface and a first-stage second surface opposite to each other, the first-stage first surface is formed with first-stage interconnect terminals thereon, the first-stage second surface is formed with first-stage first alignment solder parts thereon. In some embodiments, the second-stage device respectively has a second-stage first surface and a second-stage second surface opposite to each other, the second-stage first surface is formed with second-stage interconnect terminals and second-stage first alignment solder parts thereon. The carrier board is formed with first-stage second alignment solder parts respectively corresponding to the first-stage first alignment solder parts. In some embodiments, at least one of the carrier board and the clamping board has an opening for injecting a molding compound therethrough.

In some embodiments, the at least one first-stage device includes a plurality of first-stage devices. As an example, the plurality of first-stage devices may include semiconductor devices that are at least partially different from each other in function, size, or shape, or may be the same as each other. In some embodiments, the at least one second-stage device includes a plurality of second-stage devices. As an example, the plurality of second-stage devices may include semiconductor devices that are at least partially different from each other in function, size, or shape, or may be the same as each other. In some embodiments, the type and specific number of the first-stage devices and the second-stage device may be appropriately selected according to specific process conditions or actual requirements (for example, the size and shape of the carrier board, the placement pitch or package size and shape of the first-stage devices and the second-stage device, manufacturing process specifications, functional design of semiconductor assemblies, etc.), and the present application is not particularly limited thereto.

In some embodiments, the carrier board or carrier is a glass carrier, a ceramic carrier, a metal carrier, an organic polymer material carrier, or a silicon wafer, or a combination of two or more of the above materials or the like. Optionally, the carrier board has an interconnect structure or a product function, e.g., an interconnect board or interposer, which is a substrate (such as a package substrate) or an interposer, and which is used as the carrier board. For example, the interposer provides horizontal and/or vertical interconnections between devices attached thereto. As an example, the first-stage second alignment solder parts can act as interconnect terminals of the interconnect board.

In some embodiments, the first-stage device is a first-stage semiconductor device, the first-stage interconnect terminals are first-stage interconnect pads or bumps formed on an active side or active surface of the first-stage semiconductor device, and the first-stage first alignment solder parts are formed on a passive surface of the first-stage semiconductor device. In other embodiments, the first-stage device is an interconnect board, which, for example, is a substrate (e.g., a package substrate) or interposer that, for example provides horizontal and/or vertical interconnections.

In some embodiments, either one of a first-stage first alignment solder part and a corresponding first-stage second alignment solder part is an alignment solder bump and the other is an alignment pad corresponding to the alignment solder bump. In other embodiments, the first-stage first alignment solder part and the corresponding first-stage second alignment solder part are both alignment solder bumps, and the melting points of the first-stage first alignment solder part and the first-stage second alignment solder part can be the same or different. As an example, the first-stage alignment solder bumps may be prefabricated on a first-stage device (e.g., a wafer) or a carrier using a bumping process (e.g., electroplating, ball-planting, stencil printing, evaporation/sputtering, etc.) known in the art. As an example, the first-stage alignment solder parts may be fabricated on the first-stage device or the carrier board in advance using a deposition (e.g., metal layer)—photolithography-etching process. In some embodiments, any other solder part configuration or form may be used as long as the first-stage first and second alignment solder parts are capable of being soldered to each other for alignment purposes.

In some embodiments, the first-stage first alignment solder parts and the first-stage second alignment solder parts correspond respectively to each other in volume, size, geometry, composition, distribution, location, and number, so that the first-stage device(s) can be precisely aligned to the respective target position(s) on the carrier board by soldering to the first-stage first alignment solder parts respectively to the first-stage second alignment solder parts.

In some embodiments, the specific volume, size, geometry, composition, distribution, location and number of the first-stage first alignment solder parts and/or the first-stage second alignment solder parts may be appropriately selected according to specific process conditions or actual requirements (for example, the size and shape of the carrier board and the first-stage device, the placement pitch or package size and shape of the first-stage device, etc.), and the present application is not particularly limited thereto. For example, the first-stage first alignment solder parts may be formed in substantially the same volume, size, geometry, or composition for all first-stage devices regardless of whether functions, sizes or shapes are identical to each other, and the first-stage second alignment solder parts on the carrier board may be formed in substantially the same volume, size, geometry or composition, so as to reduce the complexity of subsequent processes and improve the packaging efficiency. For another example, for first-stage devices with different functions, sizes or shapes, the first-stage first alignment solder parts and the first-stage second alignment solder parts may be formed with different volumes, sizes, geometries or compositions so that different bond pad heights may be formed after subsequent bonding to achieve a particular function or to meet a particular requirement. In some embodiments, for a plurality of first-stage devices, the first-stage first alignment solder parts and/or the first-stage second alignment solder parts are configured to enable first surfaces of the plurality of first-stage devices to lie in a same plane parallel to a surface of the first carrier board after subsequent formation of first-stage first alignment solder bonds or joints. For another example, each of the first-stage devices may have at least three first-stage first alignment solder parts formed thereon that are substantially regularly distributed so as to enable a first-stage second surface of a first-stage device to be securely and stably held in a plane substantially parallel to the carrier board by the soldering of the first-stage first alignment solder parts and the first-stage second alignment solder parts. For another example, the first-stage first alignment solder parts may be formed on each of the first-stage devices in a region on the first-stage second surface proximate to the edge thereof so as not to interfere with subsequent processes and product applications.

Optionally, the first-stage device is further provided with at least one through electrode for vertical interconnection. For example, for the first-stage semiconductor device, the through via is a Through Silicon Via (TSV). As another example, for the interposer, the through via is a TSV or a Through Glass Via (TGV). As another example, the through electrode may be a Plated Through Hole (PTH) or a via (via) in the substrate. In some embodiments, at this time, the first-stage device may be further formed with other interconnect terminals (for example, the first-stage first alignment solder parts may be part thereof) on a first-stage second surface opposite to the first-stage first surface, and one end of the at least one through electrode is electrically connected to at least a part of the first-stage interconnect pads, respectively, and the other end of the at least one through electrode is electrically connected to a respective one of the other interconnect terminals.

In some embodiments, the second-stage device is a second-stage semiconductor device. When the second-stage device is a second-stage semiconductor device, the second-stage interconnect terminals and the second-stage first alignment solder parts are formed on an active surface of the second-stage semiconductor device. In other embodiments, the second-stage device is an interconnect board. As an example, the interconnect board is a substrate (such as a package substrate) or an interposer (interposer). For example, the interposer provides horizontal and/or vertical interconnections.

As an illustrative embodiment, at least one of the at least one first-stage device and the at least one second-stage device comprises at least one semiconductor device.

In some embodiments, a second-stage first alignment solder part is a second-stage alignment solder bump or second-stage alignment pad. As an example, the second-stage alignment solder bumps may be prefabricated on a second-stage device using a bumping process (e.g., electroplating, ball-planting, stencil printing, evaporation/sputtering, etc.) known in the art. As an example, the second-stage alignment solder parts may be fabricated on the second-stage device in advance using a deposition (e.g., metal layer)—photolithography-etching process.

In some embodiments, the specific volume, size, geometry, composition, distribution, location and number of the second-stage first alignment solder parts may be appropriately selected according to specific process conditions or actual requirements (for example, the size and shape of the first-stage device(s) and the second-stage device(s), the placement pitch or package size and shape of the first-stage device(s) and the second-stage device, etc.), and the present application is not particularly limited thereto. For example, the second-stage first alignment solder parts may be formed in substantially the same volume, size, geometry or composition for all second-stage devices regardless of whether functions, sizes or shapes are identical to each other, and the second-stage second alignment solder parts on the carrier board may be formed in substantially the same volume, size, geometry or composition, so as to reduce the complexity of subsequent processes and improve the packaging efficiency. For another example, for second-stage devices with different functions, sizes or shapes, the second-stage first alignment solder parts and the second-stage second alignment solder parts may be formed with different volumes, sizes, geometries or compositions so that different bond pad heights may be formed after subsequent bonding to achieve a particular function or to meet a particular requirement. As another example, each of the second-stage devices may have at least three second-stage first alignment solder parts formed thereon, which are substantially regularly distributed, so that the second-stage first surface of the second-stage device can be securely and stably held in a plane substantially parallel to the carrier board by the second-stage alignment solder joints formed by the later-described soldering process. In some embodiments, the second-stage first alignment solder parts can be distributed on an edge sufficiently far from the second-stage interconnect terminals on each of the second-stage devices so as not to interfere with subsequent processes and product applications.

In some embodiments, the second-stage interconnect terminals are second-stage interconnect bumps, which, for example, can be pre-formed on interconnect pads of the second-stage device(s) using a bumping process known in the art (e.g., electroplating, ball-planting, stencil printing, evaporation/sputtering, etc.). For example, a second-stage interconnect bump may be in the form of a conductive pillar. In an alternative embodiment, the second-stage interconnect terminal is a second-stage interconnect pad. Optionally, the second-stage device is further provided with at least one through electrode for vertical interconnection. For example, for the second-stage semiconductor device, the through via is a Through Silicon Via (TSV). As another example, for the interposer, the through via is a TSV or a Through Glass Via (TGV). As another example, the through electrode may be a Plated Through Hole (PTH) or a via (via) in the substrate. In some embodiments, at this time, the second-stage device may be further formed with other interconnect terminals on a second-stage second surface opposite to the second-stage first surface, and one end of the at least one through electrode is electrically connected to at least one of the second-stage interconnect terminals, respectively, and the other end of the at least one through electrode is electrically connected to one of the other interconnect terminals, respectively.

In some embodiments, the opening is formed in the carrier board and is spaced apart from the second alignment solder bump. As an example, the opening is provided outside an area defined by a target position of the at least one first-stage device on the first carrier board. For example, in the case where a plurality of first-stage devices are present, the opening is provided in a region between target positions of the plurality of first-stage devices. In some embodiments, the opening is formed on the clamping board and is spaced apart from the first surface of the at least one first-stage device when the clamping board is affixed to the first surface of the at least one first-stage device. In some embodiments, one or more opening is formed either or each of the carrier board and the clamping board. In some embodiments, the size, geometry, number or distribution of the openings can be appropriately selected according to the process conditions related to the subsequent molding or encapsulation process or the actual requirements related to, e.g., a molding material used in the encapsulation process, and the present application is not particularly limited to the size, geometry, number or distribution of the openings as long as the injection molding can be effectively performed for the purpose of molded encapsulation.

Figure 4A:
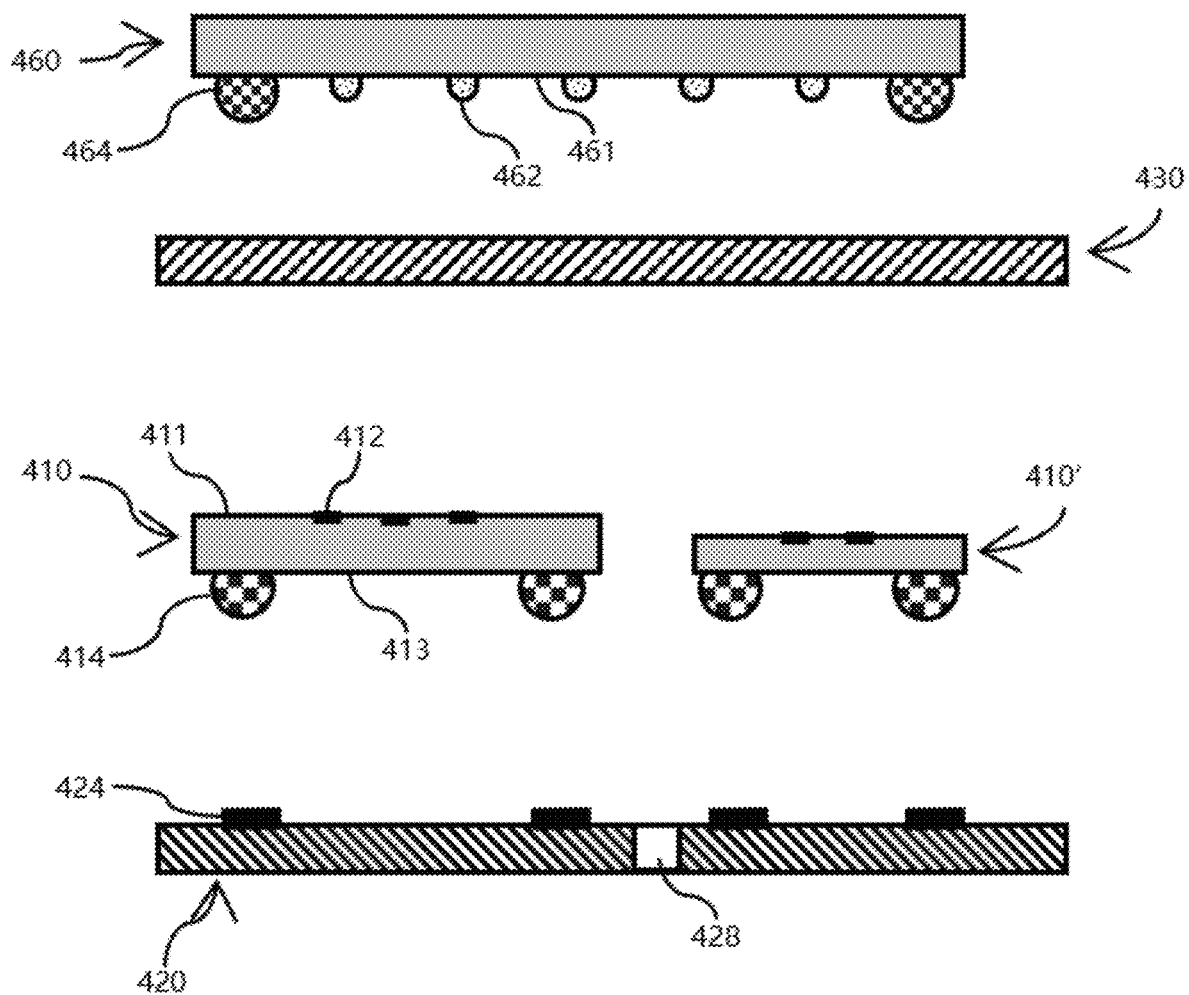
FIG. 4A to 4L show cross-sectional views for schematically illustrating a packaging method and a package according to some embodiments.

In some embodiments, as shown in FIG. 4A, a plurality of first-stage devices 410, at least one second-stage device 460, and a carrier board 420 are provided. At least two of the first-stage devices 410, 410' are different, e.g., different in size and/or function, among the plurality of first-stage devices. It is to be appreciated that although only the reference numerals of the relevant portions of the first-stage semiconductor device 410 are shown in FIG. 4A for ease of illustration and the description below is made in conjunction therewith, the description applies equally to the corresponding similar portions of the first-stage semiconductor device 410'. First-stage interconnect pads 412 are formed and distributed on the first (active) surface 411 of each first-stage device 410 (and/or 410') and first-stage alignment solder bumps 414 are formed on the second (passive) surface 413. The second-stage semiconductor devices 460 are formed with second-stage interconnect bumps 462 and second-stage first alignment solder bumps 464 distributed over the active surface 461. First-stage alignment pads 424 are formed on a surface of the carrier board 420 in corresponding positions as the first-stage alignment bumps 414 on each first-stage device 410 (and/or 410'). An opening 428 for injection molding is formed through the carrier board 420 in a region between target positions corresponding to the first-stage devices 410, 410'. Alternatively, passive devices may be similarly provided in addition to first-stage devices. For example, first-stage device 410' shown in FIG. 4 may be replaced with a passive device.

S320—placing the at least one first-stage device on the carrier board such that the first-stage first alignment solder parts are substantially aligned with the first-stage second alignment solder parts.

In some embodiments, "substantial alignment" may mean each first-stage first alignment solder part and the corresponding first-stage second alignment solder part contacting each other, respectively, without being precisely centered in a direction perpendicular to the second surface. Here, "centered" is generally meant that the centers of the corresponding first and first-stage second alignment solder bumps are aligned in a direction perpendicular to the active or second surface. It should be noted that "substantial alignment" of a first-stage first alignment solder part with the corresponding first-stage second alignment solder part means that there is at least contact between the first-stage first alignment solder part and the corresponding first-stage second alignment solder part to the extent that self-alignment is possible by virtue of the principle of minimum surface energy of the alignment solder parts in a molten or partially molten state during soldering, as described below, and thus "substantial alignment" includes a state of imprecise alignment but at least physical contact, but may not exclude a state of exact alignment.

In some embodiments, when the first-stage device is placed on the carrier board in step S320, the second surface of the first-stage device faces the carrier board (i.e., the surface on which the first-stage first alignment solder part is formed), and the first surface of the first-stage device faces away from the carrier board.

Figure 4B:
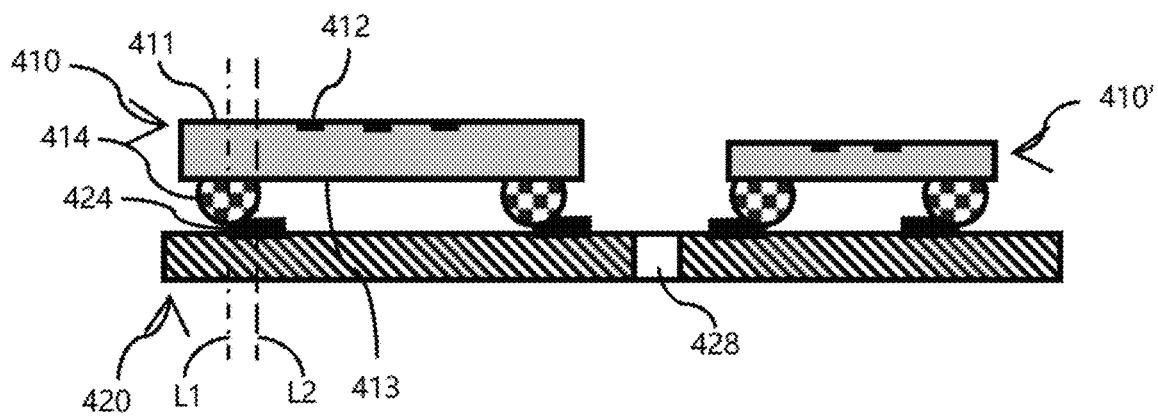

In some embodiments, as shown in FIG. 4B, first-stage device 410 (and/or 410') is placed on carrier board 420 such that alignment solder bumps 414 are in contact with corresponding alignment pads 424. At this time, alignment solder bump 414 may be somewhat misaligned with alignment pad 424, i.e., the vertical centerline L1 of alignment solder bump 414 and the vertical centerline L2 of alignment pad 424 are not coincident.

S330—forming alignment solder joints by soldering the first-stage first alignment solder parts to respective ones of the first-stage second alignment solder parts so that the at least one first-stage device is precisely aligned and fixed to the carrier board.

In some embodiments, "precise alignment" indicates a state where a deviation between an actual position and a target position of the first-stage device on the carrier board is within a tolerance in the art or a preset tolerance. In some embodiments, precise alignment is achieved using the principle of minimum surface energy exhibited by the solder joint or bonds formed by soldering corresponding first-stage first and second alignment solder parts in a molten or partially molten state during soldering. In particular, when the first-stage first alignment solder part and the first-stage second alignment solder part are in contact with each other but are not precisely centered in a direction perpendicular to the second surface of the first-stage device or the carrier board, in the soldering process, one of the first-stage first alignment solder part and the first-stage second alignment solder part, which can be an alignment solder bump, is melted or partially melted and wets the other one of the first-stage first alignment solder part and the first-stage second alignment solder part, which can be an alignment solder pad or another alignment solder bump, or both the first and second alignment solder parts melt or partially melt as alignment solder bumps, thereby forming an alignment solder joint in a molten or partially molten state. In some embodiments, the alignment solder part in the molten or partially molten state tends to reshape itself based on a minimum surface energy principle to bring the first-stage first alignment solder part and the first-stage second alignment solder part closer to a centered state, thereby driving the first-stage device which is lighter relative to the carrier board toward its target position to be accurately aligned with the carrier board.

In some embodiments, after the first-stage first alignment solder part and the first-stage second alignment solder part are bonded to form a solder joint, the second surface of the first-stage device and the carrier board are spaced apart to form a certain space therebetween due to the height of the alignment solder joint itself (in a direction perpendicular to the second surface of the first-stage device or the carrier board) formed thereby.

In some embodiments, each alignment solder bump is made of solder, and soldering may be performed by various means known in the art for melting solder, including but not limited to reflow soldering, laser soldering, high frequency soldering, infrared soldering, and the like. By way of example, soldering may be performed using a flux or a solder paste.

Figure 4C:
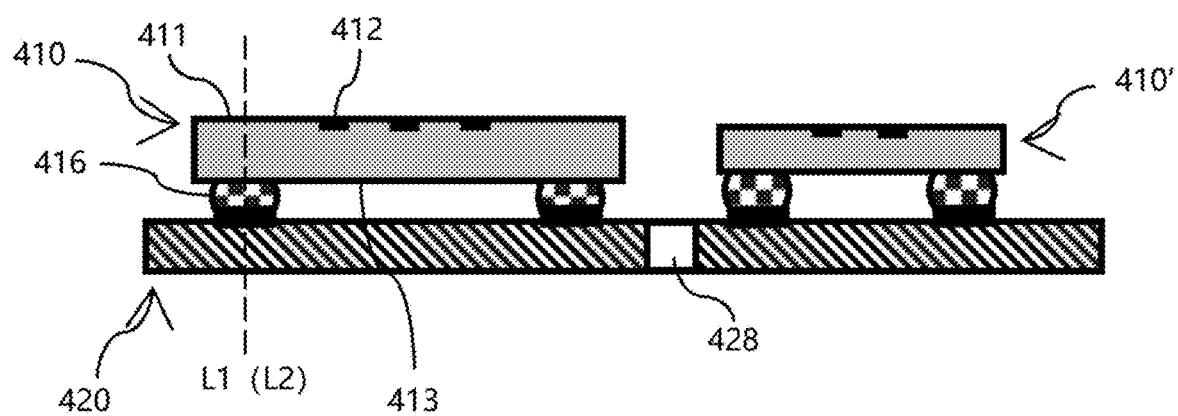

In some embodiments, alignment solder bumps 414 and alignment solder pads 424 are bonded to form alignment solder joints 416, as shown in FIG. 4C. During the soldering process, an alignment solder bump 414 in a molten state wets the corresponding alignment pad 424 and self-aligns with the alignment pad 424 (i.e., the vertical center line L1 of the alignment solder bump 414 coincides with the vertical center line L2 of the alignment pad 424) based on its minimum surface energy principle, so that the first-stage device 410 (and/or 410') is brought into alignment with the first carrier board 420. After the soldering is completed, the second surface 413 of the first-stage device 410 (and/or 410') is spaced apart from the first carrier board 420 to form a space therebetween.

In some embodiments, after S330, the packaging method 300 further comprises: turning over the first-stage device and the carrier board together as a whole to enable the first surface of the first-stage device to face downward (e.g., toward the earth), and the alignment solder joints are cooled after melting or partially melting the alignment solder joints again to solidify the alignment solder joints. In some embodiments, the alignment solder joints, which are re-melted or partially melted at this time, are moderately elongated by the weight of the first-stage device, whereby the self-alignment accuracy can be further improved. It should be noted that the first-stage device will not fall off the carrier board due to its own weight because of the surface energy of the alignment solder in the molten state or the partially molten state. As an alternative embodiment, in S310, viscous flux is pre-coated on the first-stage first and/or second alignment solder parts, and S330 includes: before the soldering is performed, turning over the first-stage device and the carrier board together as a whole so that the first surface of the first-stage device faces downward (toward the earth). In some embodiments, the alignment solder joints, which are melted or partially melted during soldering, are moderately elongated by the weight of the first-stage device after being flipped, whereby the self-alignment accuracy can be further improved. It should be noted that, since the viscous flux adheres the first-stage device to the carrier, the first-stage device would not fall off from the carrier due to its own weight after being turned over. In some embodiments, before S340 described below, the first-stage device and the carrier board together as a whole need to be flipped again.

In some embodiments, when the first-stage device includes multiple first-stage devices, S330 includes a leveling process to level the first surfaces of the first-stage devices using a leveling plate when the first-stage devices are precisely aligned with the carrier board and the alignment solder joints are still in a molten or partially molten state, so that the first surfaces of the first-stage devices are leveled with respect to each other to be basically positioned in a same plane parallel to the carrier board. As an example, the leveling process includes: placing the leveling plate over the first surfaces of the first-stage devices; pressing the leveling plate toward the carrier board such that the first surfaces of the plurality of first-stage devices lie substantially in a same plane parallel to the carrier board; while maintaining the pressing, cooling to substantially solidify the alignment solder joints; and removing the leveling plate. As an alternative embodiment, when the at least one first-stage device includes a plurality of first-stage devices, after S330, the packaging method 300 further comprises performing a leveling process, including: melting or partially melting the alignment solder joints again, leveling the first surfaces of the plurality of first-stage devices using a leveling plate so that the first surfaces of the plurality of first-stage devices are basically positioned in a same plane parallel to the carrier board. As an example, the leveling process includes: melting or partially melting the alignment solder joints again; placing the leveling plate over the first surfaces of the plurality of first-stage devices; pressing the leveling plate toward the carrier board such that the first surfaces of the plurality of first-stage devices lie substantially in a same plane parallel to the carrier board; while maintaining the pressing, cooling the assembly to substantially solidify the alignment solder joints; and removing the leveling plate. In some embodiments, since the leveling plate is not removed until the alignment solder joint has substantially solidified, the surface energy of the molten pad is prevented from restoring the first-stage device to its original height prior to the leveling plate.

Figure 4D:
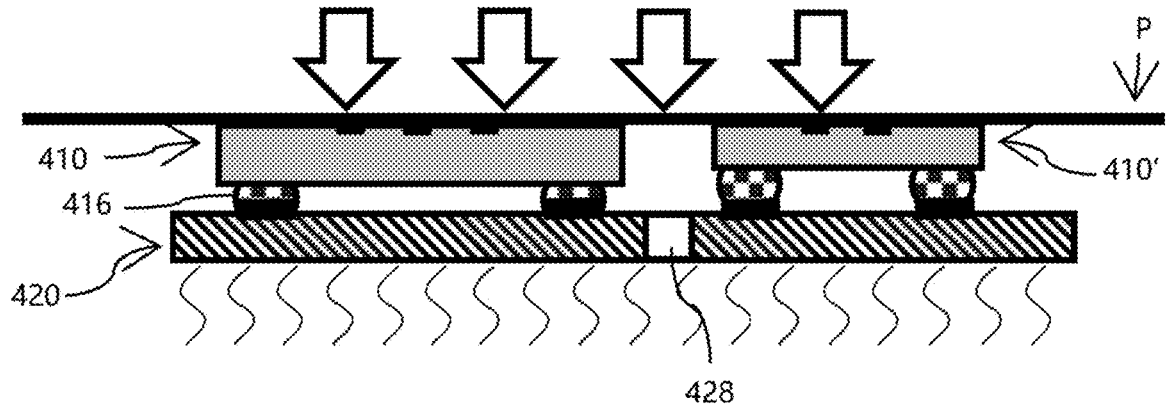

In some embodiments, as shown in FIG. 4D, after the alignment solder joints 416 are again brought into a molten or partially molten state by heating, and after the leveling plate P is placed on the first surfaces 411 of the plurality of first-stage devices 410 (and/or 410'), the leveling plate P is pressed (i.e., toward the carrier board 420) to perform a pressing or leveling process to keep the first surfaces of the plurality of first-stage devices 410, 410' in the same plane parallel to the carrier board 420 while he alignment solder joints 416 are solidifying. The temperature is decreased while the pressing is maintained to solidify the alignment solder joints 416, and then the leveling plate P is removed.

Thus, the first surfaces of all first-stage devices can be precisely flush and at the same height from the carrier board. In some embodiments, a suitable pressure needs to be applied to the leveling plate such that the alignment solder joints in the molten or partially molten state are suitably deformed and the resulting vertical (with respect to the first surface of the first-stage device or the first carrier board) displacement of the leveling plate is suitable to prevent damage to the first-stage device. As an example, a solder trap is formed in advance around each first-stage second alignment solder part of the carrier board, thereby preventing uncontrolled random flow of excess molten solder during the leveling process.

In some embodiments, the leveling process using a leveling plate described above is combined with the solder process or the remelting process after the inversion described above. As an example, S330 is performed after turning over the first-stage device and the carrier board together as a whole is performed in S330, or the leveling process is performed after S330 including turning over the first-stage device and the carrier board together as a whole is performed, or turning over the first-stage device and the carrier board together as a whole is performed after S330 including the leveling process is performed, or the leveling process is performed when the first-stage device and the carrier board together as a whole is turned over, and the alignment solder joints are cooled after melting or partially melting the alignment solder joints again to solidify the alignment solder joints.

S340—performing injection molding through the opening to form a molded package body that encapsulate the at least one first-stage device between the carrier board and the clamping board, which is attached to the first surface of the at least one first-stage device in advance of step S340.

In some embodiments, not only the side surfaces of the first-stage device are encapsulated, but the space between the second surface of the first-stage device and the carrier board is also filled with the molding compound. In some embodiments, the first-stage first surface is substantially planar and thus the clamping board is substantially flush with the first-stage first surface. Thus, the first-stage first surface of the first-stage device, including the first-stage interconnect pads, is not encapsulated by the injection molding.

In some embodiments, the injection molding is performed through openings formed on the carrier board and/or the clamping board.

In some embodiments, S330 includes attaching the clamping board on the first surface of the at least one first-stage device, for example, before the leveling process.

In other embodiments, after forming the alignment solder joints and before injecting the molding compound through the opening, the packaging method 300 further comprises attaching the clamping board to the first surface of the at least one first-stage device. As an example, attaching the clamping board is performed before the leveling process. As another example, attaching the clamping board is performed after the leveling process. As yet another example, attaching the clamping board is performed after S330. In still other embodiments, the leveling plate is retained as a clamping board after the leveling process. Thus, materials required by the process can be reduced and the whole process flow can be simplified by reusing the leveling plate as the clamping board. As an example, S330 includes: when the first-stage devices are precisely aligned with the carrier board and the alignment solder joints are still in a molten or partially molten state, the clamping board is used as a leveling plate to carry out the pressing treatment on the first surfaces of the first-stage devices, so that the first surfaces of the first-stage devices are basically positioned in the same plane parallel to the carrier board until the alignment solder joints are substantially solidified. As another example, after forming the alignment solder joints and before injecting the molding compound through the opening, the packaging method 300 further comprises: melting or partially melting the alignment solder joints again, leveling the first surfaces of the plurality of first-stage devices by using the clamping board as a leveling plate, so that the first surfaces of the plurality of first-stage devices are basically positioned in the same plane parallel to the carrier board until the alignment solder joints are substantially solidified In some embodiments, the molding encapsulation is performed using a molding compound of a resinous material (e.g., epoxy).

Figure 4E:
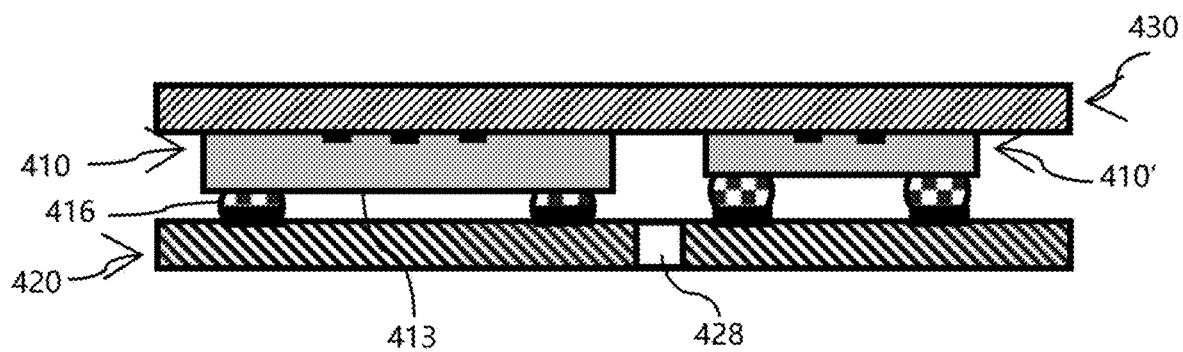
Figure 4F:
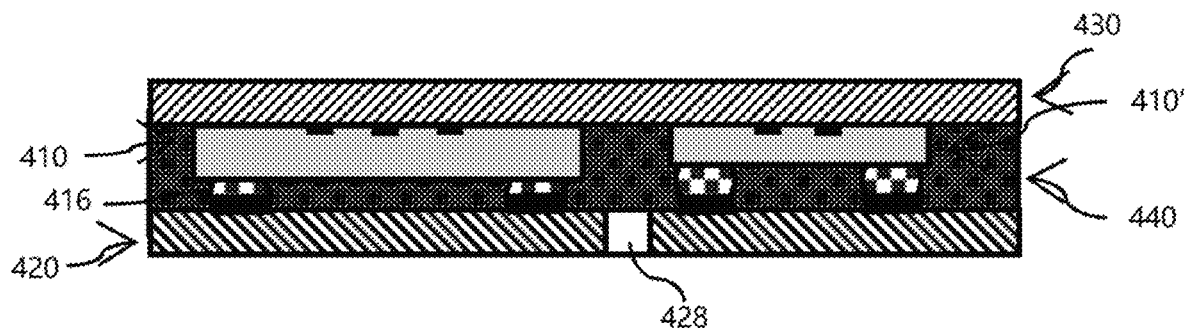

In some embodiments, as shown in FIG. 4E, after placing or attaching the clamping board 430 on the first surfaces 412 of the first-stage devices 410, 410', as shown in FIG. 4F, injection molding is performed through the opening 428 of the carrier 420 or the clamping board 430, thereby forming a molded package body 440 encapsulating the first-stage devices 410, 410' between the carrier 420 and the clamping board 430.

S350—removing the clamping board 430 to expose the interconnect terminals.

In some embodiments, the clamping board 430 is removed by stripping, etching, ablating, grinding, and the like, as known in the art.

Figure 4G:
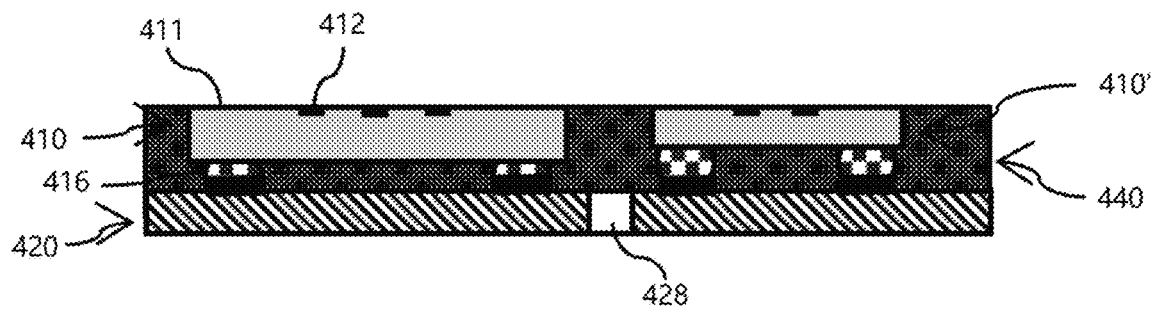

In some embodiments, as shown in FIG. 4G, the clamping board 430 is removed from the molded package body 440 to expose the first surface 411 of the first-stage device 410, 410', i.e., the first-stage interconnect pads 412.

S360—sequentially forming an interconnect layer and interposer terminals corresponding to the second-stage interconnect terminals on a side of the molded package body where the first-stage first surface is exposed such that at least some of the first-stage interconnect pads are electrically connected to the interposer terminals, respectively, through the interconnect layer.

Figure 4H:
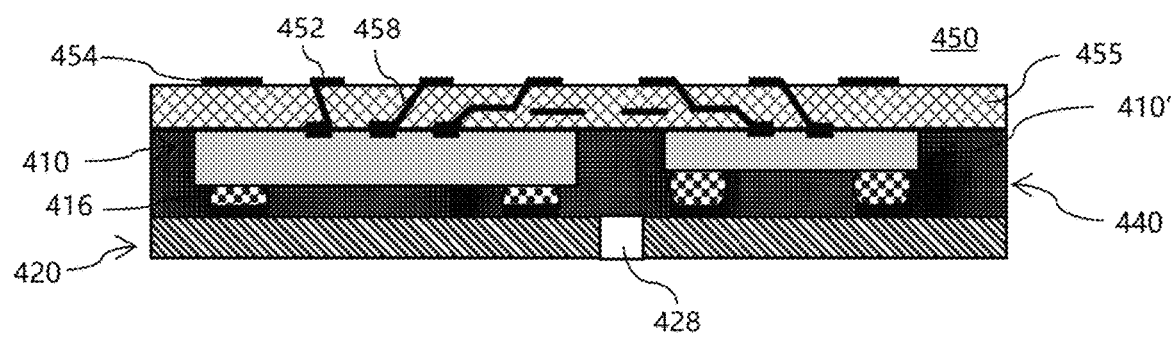
Figure 4H:
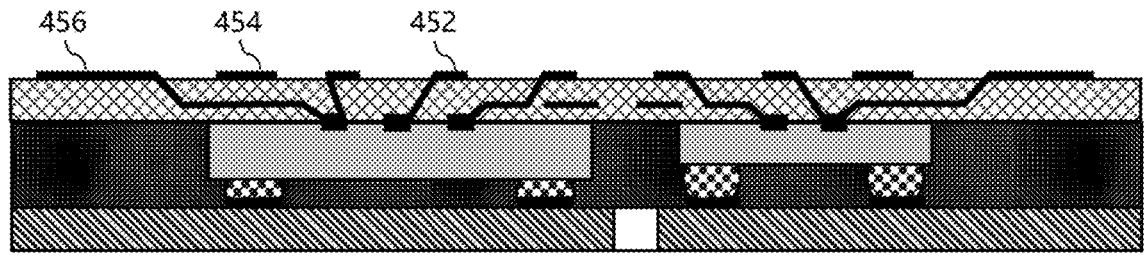

S360a—forming second-stage second alignment solder parts corresponding to the second-stage first alignment solder parts, respectively, on the interconnect layer, resulting in a first-stage assembly, as shown in FIG. 4H and discussed further below.

In some embodiments, the interconnect layer includes a redistribution layer (RDL) to realize conductive connection of the first-stage interconnect terminals with the interposer terminals. In some embodiments, the interconnect layer further includes an insulating layer for achieving electrical insulation between the conductive paths, and the specific number and material of the insulating layer may be appropriately selected according to specific process conditions or needs, which is not particularly limited in the present application.

In some embodiments, either one of a second-stage first alignment solder part and a corresponding second-stage second alignment solder part is an alignment solder bump and the other is an alignment pad corresponding to the alignment solder bump. In other embodiments, the second-stage first alignment solder part and the corresponding second-stage second alignment solder part are both alignment solder bumps, and the melting points of the second-stage first alignment solder part and the second-stage second alignment solder part can be the same or different. As an example, the second-stage alignment solder bumps may be prefabricated on a second-stage device (e.g., a wafer) or a carrier using a bumping process (e.g., electroplating, ball-planting, stencil printing, evaporation/sputtering, etc.) known in the art. As an example, the second-stage alignment solder parts may be fabricated on the second-stage device or the carrier board in advance using a deposition (e.g., metal layer)—photolithography-etching process. In some embodiments, any other solder part configuration or form may be used as long as the second-stage first and second alignment solder parts are capable of being soldered to each other for alignment purposes.

In some embodiments, the second-stage first alignment solder parts and the second-stage second alignment solder parts correspond respectively to each other in volume, size, geometry, composition, distribution, location, and number, so that the second-stage device(s) can be precisely aligned to the respective target position(s) on the carrier board by soldering to the second-stage first alignment solder parts respectively to the second-stage second alignment solder parts.

In some embodiments, the specific volume, size, geometry, composition, distribution, location and number of the second-stage first alignment solder parts and/or the second-stage second alignment solder parts may be appropriately selected according to specific process conditions or actual requirements (for example, the size and shape of the carrier board and the second-stage device, the placement pitch or package size and shape of the second-stage device, etc.), and the present application is not particularly limited thereto. For example, the second-stage first alignment solder parts may be formed in substantially the same volume, size, geometry, or composition for all second-stage devices regardless of whether functions, sizes or shapes are identical to each other, and the second-stage second alignment solder parts on the carrier board may be formed in substantially the same volume, size, geometry or composition, so as to reduce the complexity of subsequent processes and improve the packaging efficiency. For another example, for second-stage devices with different functions, sizes or shapes, the second-stage first alignment solder parts and the second-stage second alignment solder parts may be formed with different volumes, sizes, geometries or compositions so that different bond pad heights may be formed after subsequent bonding to achieve a particular function or to meet a particular requirement.

In some embodiments, the second-stage interconnect terminals are second-stage interconnect bumps, and the interposer terminals are interposer bumps or interposer pads. In other embodiments, the second-stage interconnect terminals are second-stage interconnect pads, and the interposer terminals are interposer bumps. By way of example, the interposer bumps may be formed by a bump forming process known in the art (e.g., electroplating, ball-planting, stencil printing, evaporation/sputtering, etc.), and the interposer pad may be formed by a deposition-lithography-etching process (e.g., metal layer) known in the art, which is not particularly limited in this application.

In some embodiments, the interposer terminals correspond to the second-stage interconnect terminals in terms of volume, size, geometry, composition, distribution, location, and number, such that when the second-stage devices are precisely aligned to respective target locations on the first-stage assembly, the interposer terminals and the second-stage interconnect terminals can be precisely centered for stacked interconnection between the second-stage devices and the first-stage assembly as described below.

In some embodiments, in a direction perpendicular to the second-stage first surface of the second-stage device (or the interconnect layer of the first-stage assembly), the sum of the heights of the second-stage interconnect terminals and the interposer terminals is substantially less than the sum of the heights of the second-stage first alignment solder parts and the second-stage second alignment solder parts, such that the second-stage interconnect terminals and the interposer terminals are also spaced apart from each other after the second-stage first alignment solder parts and the second-stage second alignment solder parts subsequently form second-stage alignment solder joints, so as not to interfere with subsequent soldering of the second-stage first alignment solder part and the second-stage second alignment solder part, and prevent the second-stage interconnect terminal and the transfer terminal from being pressed against each other and damaged upon subsequent soldering of the second-stage first alignment solder part and the second-stage second alignment solder part.

In some embodiments, as shown in FIG. 4H, a redistribution layer (RDL) trace 458 is formed first from bottom to top on the side of the molding compound 440 where the active surfaces 411 of the first-stage semiconductor devices 410, 410' including the first-stage interconnect pads 412 are exposed, and then interposer pads 452 corresponding to the second-stage interconnect bumps 462 of the second-stage semiconductor device 460 are formed, respectively, to form conductive paths from the first-stage interconnect pads 412 to the corresponding interposer pads 452. Dielectric layer 455 is also formed during this process to electrically isolate the conductive paths, particularly when RDL traces 458 and/or interposer pads 452 are formed. In addition, second-stage alignment pads 454 corresponding to the second-stage alignment soldering bumps 464, respectively, are also formed on the dielectric layer 455. Thereby, the first-stage semiconductor assembly 450 is formed.

In some embodiments, external interconnect terminals are further formed on the interconnect layer such that some of the first-stage interconnect pads are electrically connected to the external interconnect terminals through the interconnect layer. As an example, the conductive path between them is realized by the interconnect layer. In some embodiments, at this time, of the first-stage interconnect pads, including the first-stage interconnect pads electrically connected to the interposer terminals and the first-stage interconnect pads electrically connected to the external interconnect terminals, may be independent of each other or may at least partially overlap (i.e., a first-stage interconnect pad can be electrically connected to both an interposer terminal and an external interconnect terminal). In some embodiments, the external interconnect terminals are used to interconnect the final package (i.e., the integrated package of the first-stage device and the second-stage device) with device(s) at another stage or level (e.g., a semiconductor device, an interconnect board, or a PCB board). Therefore, it is applicable to a situation in which the second-stage device does not have a through electrode (such as TSV, TGV, PTH, or via), but is not excluded from the situation in which the second-stage device is provided with a through electrode. For example, the external interconnect terminals may provide interconnection with device(s) at another stage or level together with the aforementioned additional interconnect terminals formed on the second surface of the second-stage device (hereinafter referred to as "first external connection terminals" and "second external connection terminals" respectively for convenience of distinction), it being understood that the first external connection terminals need to be high enough (for example, when a first external connection terminal takes the form of a solder ball, the size of the solder ball is large enough) at this time, so that the first external connection terminal and the second external connection terminal are substantially in the same parallel plane (i.e., with respect to the first-stage assembly) after the second-stage device is aligned and fixed to the first-stage assembly as described later, in order to achieve interconnection with device(s) at another level. As an example, the external interconnect terminals are distributed to be sufficiently spaced from the second-stage second alignment solder parts so as not to be covered by a perpendicular projection of the second-stage devices on the interconnect layer after the second-stage devices are precisely aligned to the first-stage assembly, so as not to affect stacking of subsequent second-stage devices on the interconnect layer.

In some embodiments, as shown in FIG. 4H', based on FIG. 4H, the external interconnect terminals 456 are further formed so as to be sufficiently distant from the second-stage alignment soler pad 454, and a conductive path with a part of the first-stage interconnect pad 412 is formed by RDL traces, as shown in FIG. 4H'.

S370—placing the at least one second-stage device on the first-stage assembly such that the second-stage first alignment solder parts are substantially aligned with the second-stage second alignment solder parts.

The "substantial alignment" herein can be selectively referred to the aforementioned description about the "substantial alignment" between the first-stage first alignment solder part and the first-stage second alignment solder part in S320, and thus, the description thereof is omitted.

In some embodiments, when the second-stage device is placed on the first-stage assembly in step S370, the second-stage first surface of the second-stage device (i.e., the surface formed with the second-stage second alignment solder parts) faces the first-stage assembly.

Figure 4I:
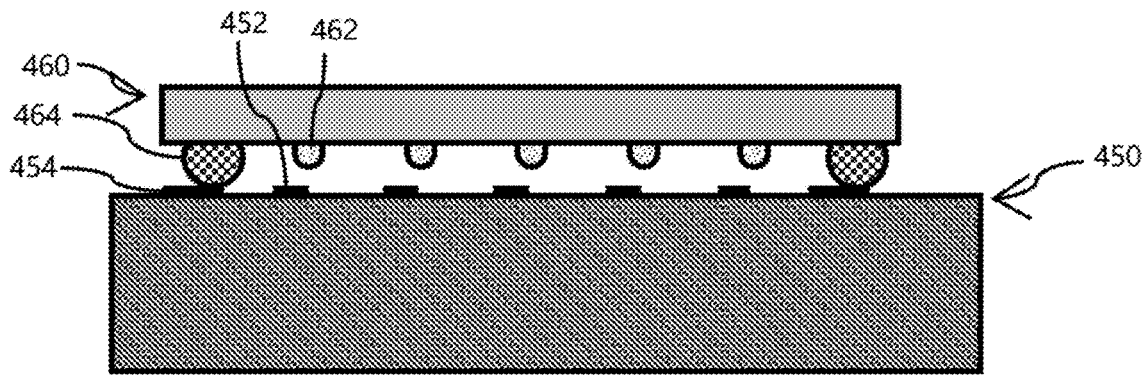

In some embodiments, as shown in FIG. 4I, the second-stage device 460 is placed on the first-stage semiconductor assembly 450 such that the second-stage alignment solder bumps 464 contact corresponding second-stage alignment pads 454. At this point, second-stage alignment solder bump 464 can be misaligned with second-stage alignment pad 454.

S380—forming second-stage alignment solder joints by soldering the second-stage first alignment solder parts and the second-stage second alignment solder parts such that the at least one second-stage device is precisely aligned to the first-stage assembly.

S380a—pressing the at least one second-stage device and the first-stage assembly toward each other in while the second-stage alignment solder joints are at least partially melted to respectively bond the second-stage interconnect terminals and the interposer terminals to form interconnection joints.

The description of "forming second-stage alignment solder joints by soldering the second-stage first alignment solder parts and the second-stage second alignment solder parts so that the at least one second-stage device is precisely aligned to the first-stage assembly" is similar to the description of step S330, and is thus omitted here.

In some embodiments, after soldering the second-stage first alignment solder parts and the second-stage second alignment solder parts, the second-stage first surface of the second-stage device (including the second-stage interconnect terminals) and the first-stage assembly are spaced apart to form a space therebetween due to the height of the second-stage alignment solder joints themselves (in a direction perpendicular to the second-stage first surface of the second-stage device) formed thereby.

In some embodiments, each second-stage alignment solder bump is made of solder, and the soldering may be performed by various means known in the art for melting solder, including but not limited to reflow soldering, laser soldering, high frequency soldering, infrared soldering, and the like. By way of example, soldering may be performed using a flux or a solder paste.

In some embodiments, in S380a, while the at least one second-stage device is in precise alignment with the first-stage assembly and the second-stage alignment solder joints are still in an at least partially molten state, the second-stage interconnect terminals and the interposer terminals are respectively joined while the at least one second-stage device and the first-stage assembly are pressed toward each other. In other embodiments, after the at least one second-stage device is precisely aligned and secured to the first-stage assembly, the second-stage alignment solder joints are again at least partially melted and the second-stage interconnect terminals and the interposer terminals are respectively joined while pressing the at least one second-stage device and the first-stage assembly toward each other in S380a.

In some embodiments, the second-stage interconnect bumps and/or the interposer bumps are made of solder, and the second-stage interconnect terminals and the interposer terminals are soldered to form interconnection joints in S380a. In some embodiments, the second-stage interconnect bumps and/or the interposer bumps do not contain solder, and the second-stage interconnect terminals and the interposer terminals are bonded by Thermal Compression Bonding (TCB) in S380a.

Figure 4J:
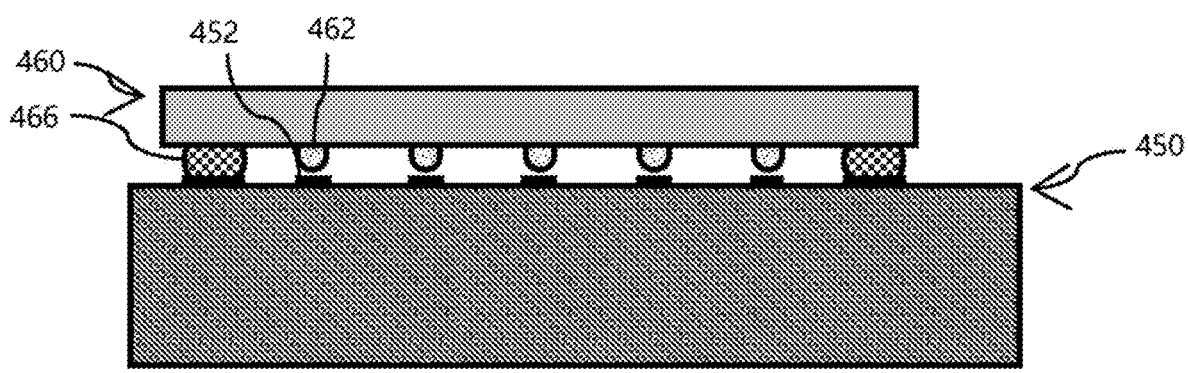
Figure 4K:
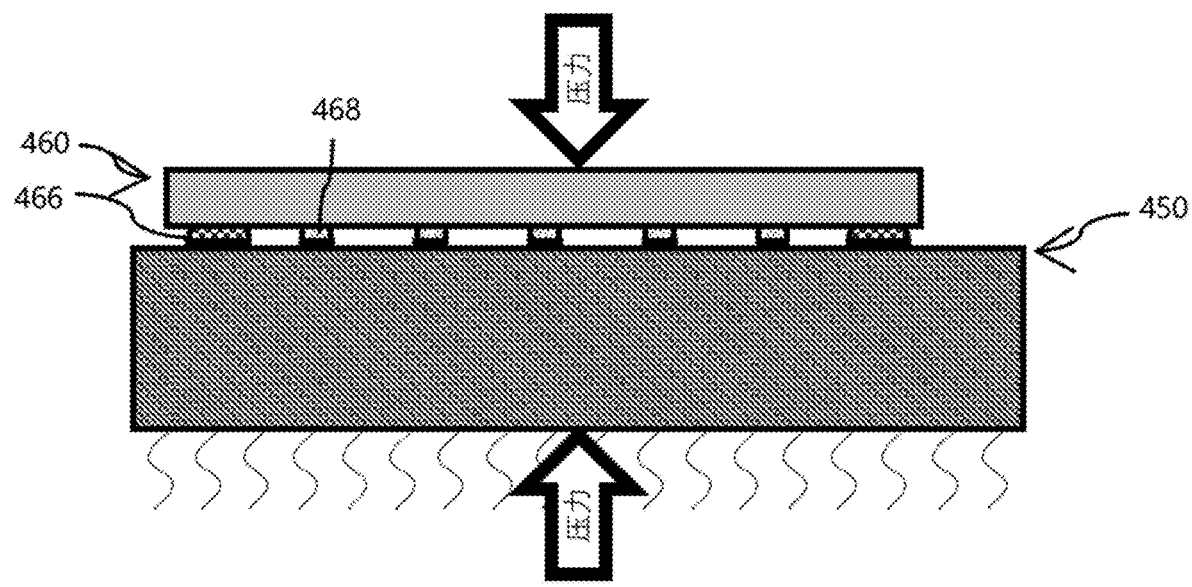

In some embodiments, second-stage alignment solder bumps 464 and second-stage alignment pads 454 are soldered to form second-stage alignment solder joints 466, as shown in FIG. 4J. During the soldering process, the molten second-stage alignment solder bumps 464 wets the second-stage alignment solder pads 454 and self-aligns with the second-stage alignment solder pads 454 based on its minimum surface energy principle, so as to drive the second-stage device 460 to achieve precise alignment on the first-stage semiconductor assembly 450. After the bonding is completed, the active surface of the second-stage device 460 is spaced apart from the first-stage semiconductor assembly 450 to form a space. Then, as shown in FIG. 4K, heating is applied while the second-stage device 460 and the first-stage semiconductor assembly 450 are pressed toward each other. At this point, the second-stage alignment solder joints 466 again at least partially melt and are further flattened, and the second-stage interconnect bumps 462 (also in an at least partially molten state) subsequently come into contact with the interposer pads 452 and form second-stage interconnect joints 468.

In some embodiments, the second-stage alignment solder joints are heated to an at least partially molten state after the structure as a whole is flipped to further improve the self-alignment accuracy by taking advantage of the weight of the second-stage device, e.g., in a process similar to that employed in S330, as discussed above.

S390—releasing the pressing.

In some embodiments, the pressing is released after the second-stage alignment solder joints and/or the interconnect joints is at least partially cured to secure the at least one second-stage device to the first-stage assembly. In some embodiments, the time required for the second-stage alignment solder joints and/or the interconnect joints to at least partially solidify to secure the at least one second-stage device to the first-stage assembly is predictable from theory and experience or measurable by prior experimentation, and the pressing may be relieved after such time has elapsed according to some embodiments.

In some embodiments, when the carrier board does not have the interconnect structure or the product function, the packaging method further includes removing the carrier board. As an example, the carrier board can be removed in any one step or between any two steps from S340 to S390.

In some embodiments, the carrier board is removed by lift-off, etching, ablation, grinding, and the like, as known in the art. As an example, when a peeling process is used, the solder between the carrier board and the first-stage device (i.e. the first-stage alignment solder joint) may be desoldered to facilitate peeling the carrier board from the molded package body.

In some embodiments, some or all of the first-stage alignment solder joints are also removed while or after the carrier board is removed. By way of example, some or all of the first-stage alignment solder joints may be removed by desoldering, etching, ablating, or grinding, among other processes known in the art. In some embodiments, some or all of the first-stage alignment solder joints are left as part of the final semiconductor assembly (i.e., the final package) for electrical connections (e.g., power and ground), heat sinking, mechanical structures, and the like.

In some embodiments, after removing the carrier board, the method 300 further comprises thinning (such as grinding, etching or ablating and the like) the surface of the molded package body, from which the carrier board is removed. By way of example, thinning to remove some of the molded enclosure (including some of the remaining first-stage alignment solder joints) from the first-stage second surface side of the first-stage device, or thinning to the first-stage second surface of the first-stage device, or thinning to include some of the first-stage second surface side of the first-stage device. In some embodiments, first-stage alignment solder joints remaining after the carrier is removed are also removed by the thinning process. Thereby, the thickness of the final semiconductor assembly can be further reduced.

Figure 4L:
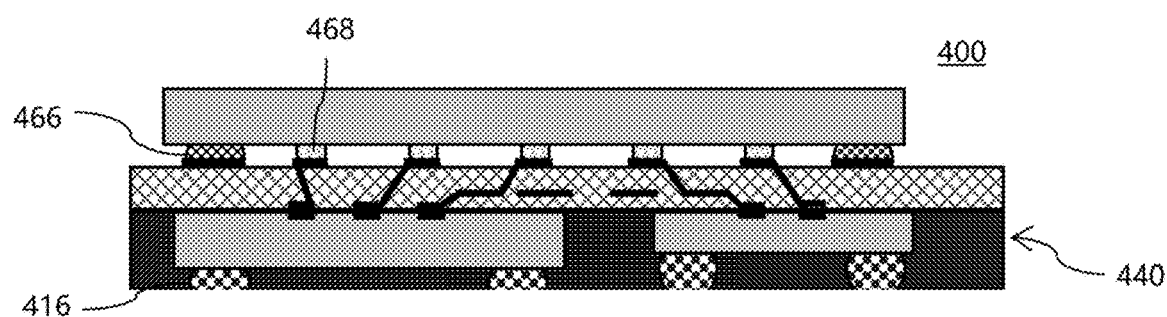

In some embodiments, as shown in FIG. 4L, after the heating is released when second-stage alignment solder joints 466 and second-stage interconnect joints 468 are substantially solidified, the pressing is released. Carrier board 420 (and part or all of first-stage alignment solder joints) are then removed by desoldering first-stage alignment solder joints 416, thereby forming semiconductor assembly 400.

In some embodiments, a space is formed between the second-stage device and the first-stage assembly due to the height of the second-stage alignment solder joints and/or the interconnect joints themselves. In some embodiments, the method 300 further comprises: underfilling a space formed between the second-stage device and the first-stage assembly.

In some embodiments, the passive devices are packaged with the at least first-stage device into a first-stage assembly in substantially the same manner as the embodiments described above.

In some embodiments, after S390, the carrier board may be diced to obtain individual semiconductor components.

In some embodiments, dicing process may be performed to fabricate individual semiconductor components according to the package specifications, or may not be performed.

Figure 5A:
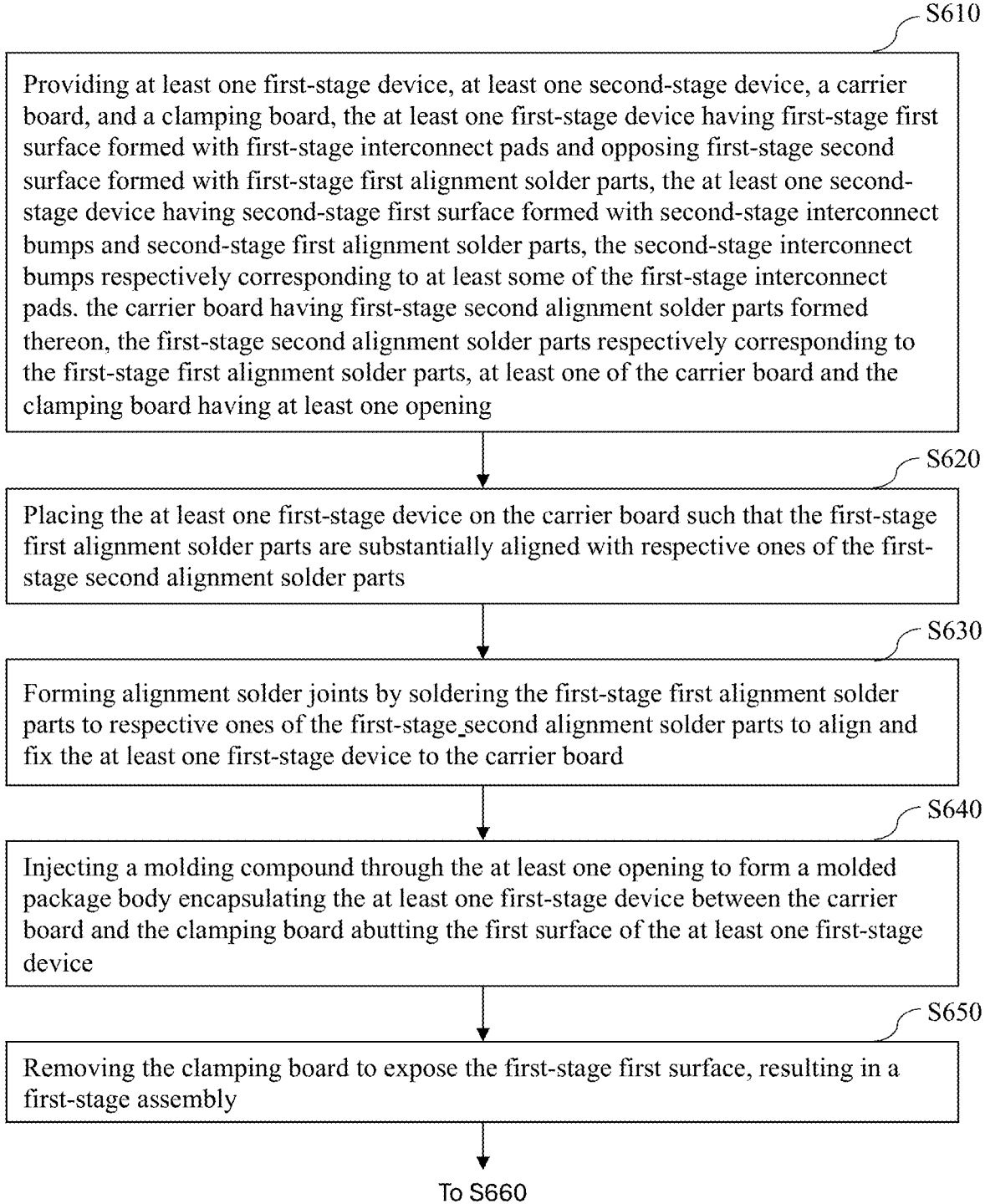
FIGS. 5A-5B show a flow chart illustrating a packaging method according to some embodiments.
Figure 5B:
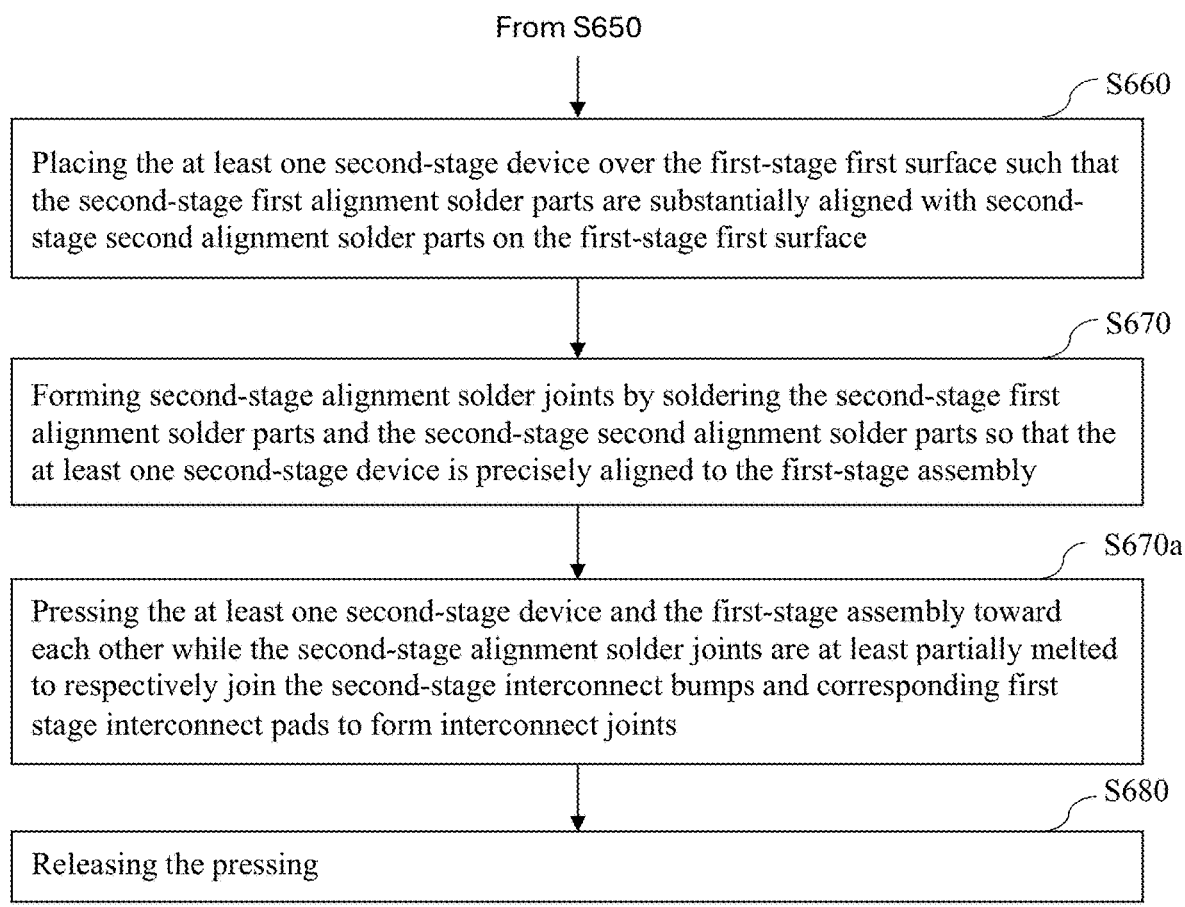

FIGS. 5A-5B show a flow chart of a packaging method 600 according to further embodiments. As shown i, the packaging method 600 includes the steps S610 to S680, which are described below. Packaging method 600 differs from packaging method 300 described above mainly in that the first-stage interconnect pads of the first-stage devices are not fanned out using, for example, an interconnect layer, but rather are directly interconnected with the second-stage interconnect terminals of the second-stage devices (which are interconnect bumps or a combination of interconnect bumps and second-stage first alignment solder joints). Therefore, in order to avoid unnecessarily obscuring other inventive concepts, description of the parts of the packaging method 600 that are similar to corresponding parts of the packaging method 600 will be omitted from the following description, for which reference is made to the description of the corresponding parts of the method 300 in the above.

S610—providing at least one first-stage device, at least one second-stage device, a carrier board and a clamping board. In some embodiments, the first-stage device is formed with first-stage interconnect pads on a first-stage first surface and first-stage first alignment solder parts on a first-stage second surface opposite the first-stage first surface; the at least one second-stage device is formed with second-stage interconnect bumps and second-stage first alignment solder parts on a second-stage first surface. In some embodiments, the second-stage interconnect bumps correspond to at least some of the first-stage interconnect pads, respectively; first-stage second alignment solder parts respectively corresponding to the first-stage first alignment solder parts are formed on the carrier board; and at least one of the carrier board and the clamping board is provided with an opening for injection molding therethrough.

In some embodiments, in order to directly interconnect at least some of the first-stage interconnect pads of the at least one first-stage device with the second-stage interconnect bumps of the at least one second-stage device, at least some of the first-stage interconnect pads need to correspond in volume, size, geometry, composition, distribution, location, and number, etc., to each other with the second-stage interconnect bumps such that when the at least one second-stage device is precisely aligned to a respective target location on the first-stage assembly, at least some of the first-stage interconnect pads can be precisely centered with the second-stage interconnect bumps for a stacked interconnection between the at least one second-stage device and the first-stage assembly as described below.

In some embodiments, the second-stage interconnect bumps correspond to the first-stage interconnect pads, respectively. In an alternative embodiment, the second-stage interconnect bumps and the second-stage first alignment solder parts together serve as second-stage interconnect terminals on the second-stage first surface of the at least one second-stage device and correspond to the first-stage interconnect pads, respectively.

Figure 6A:
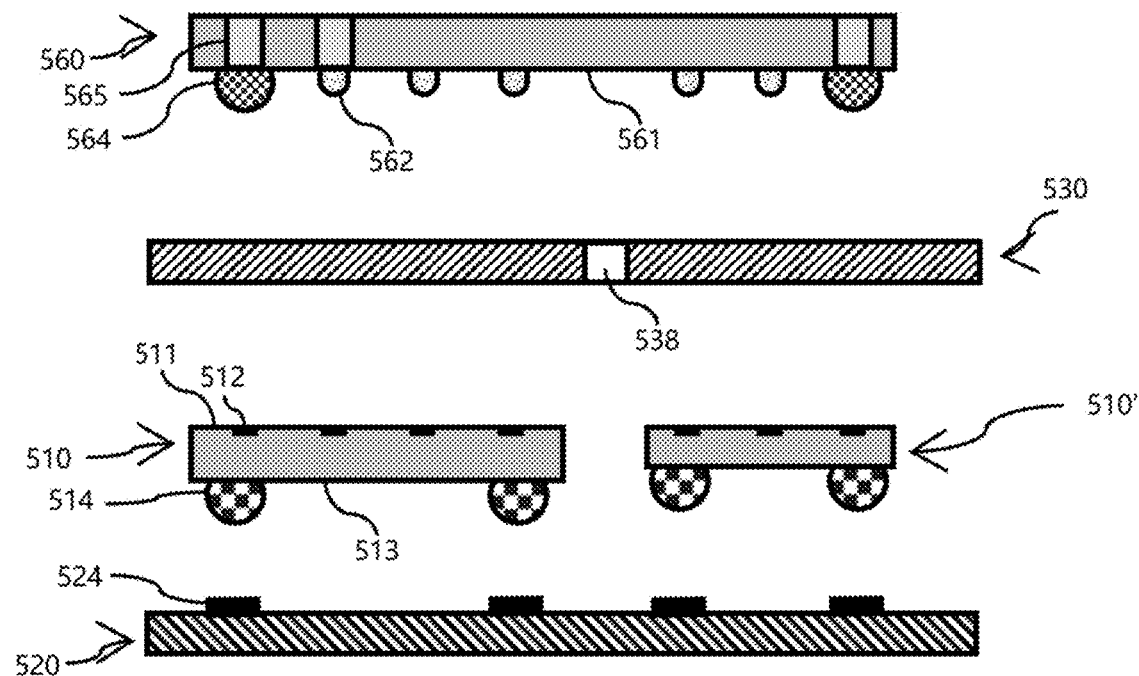
FIG. 6A to 6E show cross-sectional views for schematically illustrating a packaging method and a package according to some embodiments.

As an exemplary embodiment, as shown in FIG. 6A, two first-stage semiconductor devices 510, 510', a second-stage semiconductor device 560, a carrier board 520, and a clamp plate 530 are provided. The two first-stage semiconductor devices 510, 510' are not identical, e.g., differ in size and/or function. It is to be appreciated that although only the reference numerals of the relevant portions of the first-stage semiconductor device 510 are shown in FIG. 6A for ease of illustration and the description below is made in conjunction therewith, the description applies equally to the corresponding similar portions of the first-stage semiconductor device 510'. Each first-stage semiconductor device 510, 510' is formed with first-stage interconnect pads 512 distributed over active surface 511 and first-stage alignment solder bumps 514 formed over passive surface 513. The second-stage semiconductor device 560 is formed with second-stage interconnect bumps 562 and second-stage first alignment solder parts 564 distributed on the active surface 561 as interconnection terminals corresponding to the first-stage interconnect pads 512, respectively, and the second-stage semiconductor device 560 is further provided with TSVs 565 electrically connected to the second-stage first alignment solder parts 564 and a part of the second-stage interconnect bumps 562, respectively. First-stage alignment pads 524 are formed on a surface of the carrier 520 in the same arrangement (or relative position) as the first-stage alignment bumps 514 on the first-stage semiconductor devices 510 and 510'. Openings 538 for injection molding are formed through the clamping board 530 in regions between target locations corresponding to the first-stage semiconductor devices 510, 510'. Alternatively, passive devices may be provided in a similar structure in addition to the first-stage semiconductor device and the second-stage semiconductor device. For example, reference numeral 510' as shown in FIG. 6A may be replaced with a passive device.

S620 to S640 are similar to S320 to S340, respectively, described above. Thus, the description thereof is omitted here.

S650—removing the clamp plate to expose the first-stage first surface to form a first-stage assembly.

Figure 6B:
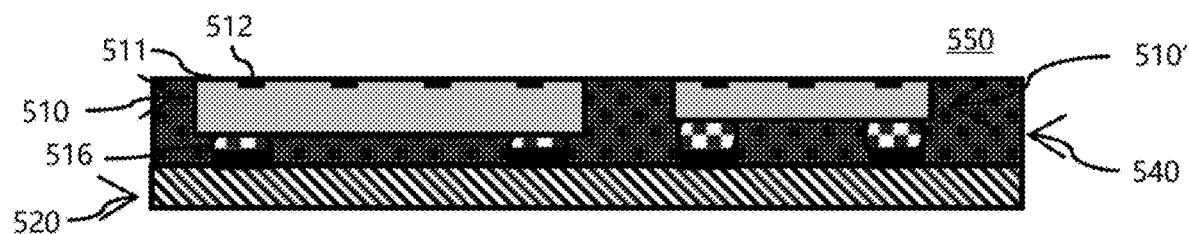

As an exemplary embodiment, as shown in FIG. 6B, the molded package body 540 exposes the active surface 511 of the first-stage semiconductor devices 510, 510', i.e., exposes the first-stage interconnect pads 512, by removing the clamping board 530, thereby forming the first-stage semiconductor assembly 550.

S660—placing the at least one second-stage device on the first-stage assembly such that the second-stage first alignment solder parts are substantially aligned with second-stage second alignment solder parts on the first-stage assembly. In some embodiments, the second-stage second alignment solder parts are pre-formed on a side of the first-stage assembly that exposes the first-stage first surface and correspond with the second-stage first alignment solder parts, respectively.

In some embodiments, when the second-stage interconnect bumps correspond to the first-stage interconnect pads, respectively, the method 400 further comprises, between S650 and S660: forming the second-stage second alignment solder parts on a side of the first-stage assembly where the first-stage first surface is exposed. As an alternative embodiment, when the second-stage interconnect bumps correspond to the first-stage interconnect pads, respectively, and the second-stage first alignment solder parts have the form of alignment solder bumps, the first-stage device is further formed with the second-stage second alignment solder parts having the form of alignment bond pads on the first-stage first surface in S610.

In some embodiments, when the second-stage interconnect bumps and the second-stage first alignment solder parts together serve as second-stage interconnect terminals on the second-stage first surface of the at least one second-stage device respectively corresponding to the first-stage interconnect pads and the second-stage first alignment solder parts have a form of an alignment solder bump, some of the first-stage interconnect pads respectively corresponding to the second-stage first alignment solder parts is served as the second-stage second alignment solder parts in S660. As an alternative embodiment, when the second-stage interconnect bumps and the second-stage first alignment solder parts together serve as second-stage interconnect terminals on the second-stage first surface of the at least one second-stage device corresponding to the first-stage interconnect pads, respectively, the method 400 further comprises, between S650 and S660: forming the second-stage second alignment solder parts having a form of an alignment solder bump on some of the first-stage interconnect pads corresponding to the second-stage first alignment solder parts, respectively.

In some embodiments, in a direction perpendicular to a second-stage first surface of the second-stage device (or a side surface of the first-stage assembly exposing the first-stage first surface), a sum of heights of the first-stage interconnect pad and the second-stage interconnect bump is sufficiently less than a sum of heights of the second-stage first alignment solder and the second-stage second alignment solder such that the first-stage interconnect pad and the second-stage interconnect bump are also spaced apart from each other after the second-stage first alignment solder and the second-stage second alignment solder subsequently form a second-stage alignment solder joint.

Figure 6C:
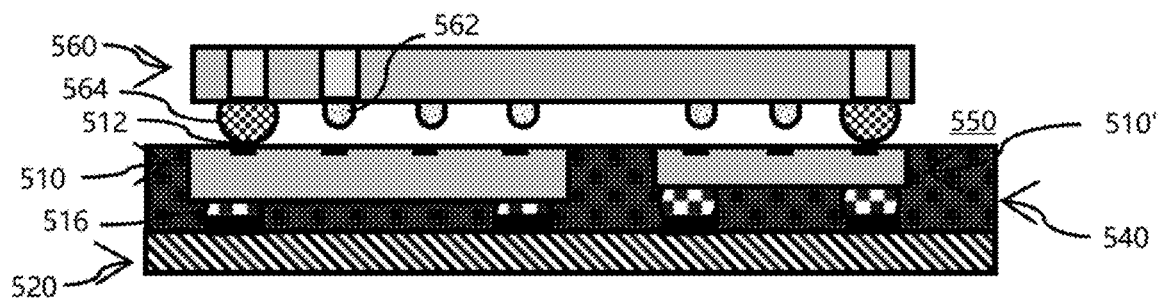

As an exemplary embodiment, the second-stage device 560 is placed on the first-stage semiconductor assembly 550 such that the second-stage alignment solder bumps 564 contact corresponding first-stage interconnect pads 512, as shown in FIG. 6C. At this point, the second-stage alignment solder bumps 564 are not aligned with the corresponding first-stage interconnect pads 512.

S670—forming second-stage alignment solder bumps by soldering the second-stage first alignment solder bumps and the second-stage second alignment solder bumps such that the at least one second-stage device is precisely aligned to the first-stage assembly.

S670a—pressing the at least one second-stage device and the first-stage assembly toward each other while the second-stage alignment solder bumps are at least partially melted to respectively bond the second-stage interconnect bumps and the corresponding first-stage interconnect pads to form interconnection joints.

In some embodiments, in S670, while the at least one second-stage device is in precise alignment with the first-stage assembly and the second-stage alignment pads are still in an at least partially molten state, the second-stage interconnect bumps and corresponding first-stage interconnect pads are respectively bonded while the at least one second-stage device and the first-stage assembly are pressed toward each other. In other embodiments, in S670, after the at least one second-stage device is precisely aligned and secured to the first-stage assembly, the second-stage alignment pads are again at least partially melted and the second-stage interconnect bumps and corresponding first-stage interconnect pads are respectively bonded while the at least one second-stage device and the first-stage assembly are pressed toward each other.

In some embodiments, the second-stage interconnect bumps are made of solder, and the second-stage interconnect bumps and the corresponding first-stage interconnect pads are respectively soldered to form interconnect pads in S670. In some embodiments, the second-stage interconnect bumps do not contain solder, and the second-stage interconnect bumps and corresponding first-stage interconnect pads are thermocompression bonded in S670.

Figure 6D:
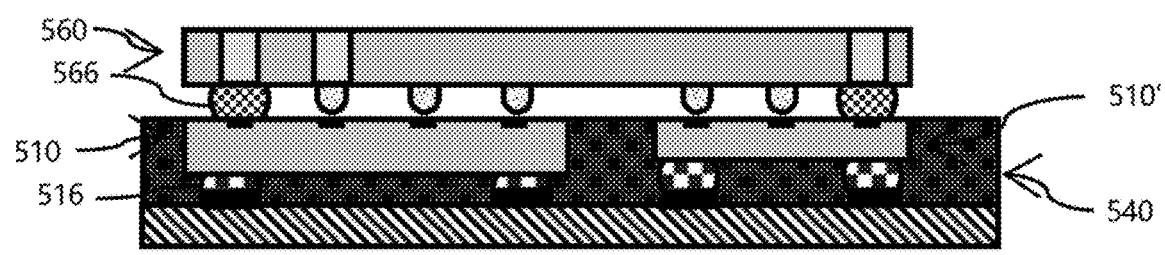
Figure 6E:
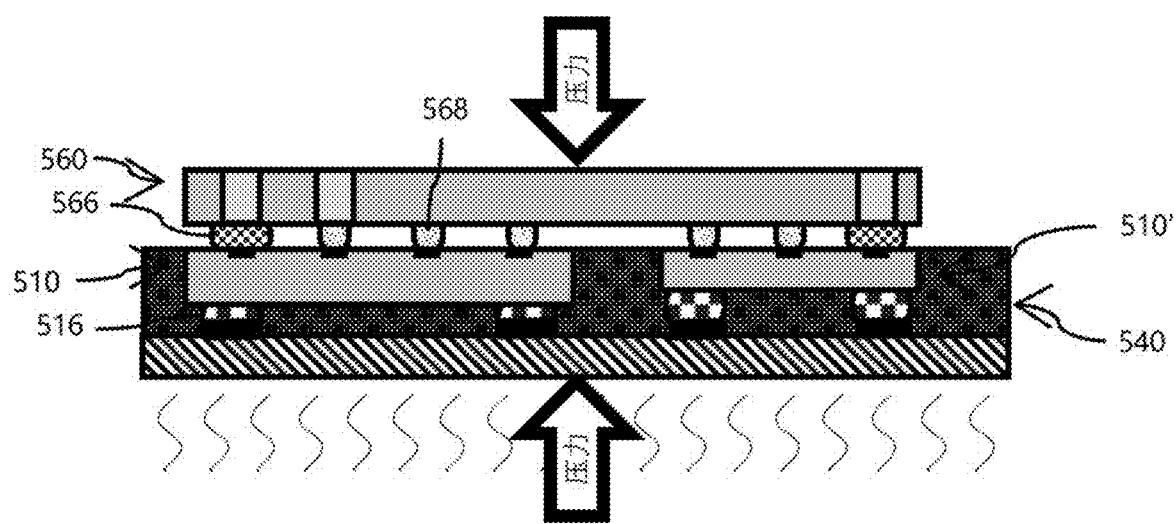

As an exemplary embodiment, second-stage alignment solder bumps 564 and corresponding first-stage interconnect pads 512 are soldered to form second-stage alignment solder joints 566, as shown in FIG. 6D. During the soldering process, each molten second-stage alignment solder bump 564 wets the corresponding first-stage interconnect pad 512 and self-aligns with the corresponding first-stage interconnect pad 512 based on its minimum surface energy principle, so as to drive the second-stage device 560 to achieve precise alignment on the first-stage semiconductor assembly 550. After the bonding is completed, the active surface of the second-stage device 560 is spaced apart from the first-stage semiconductor assembly 550 to form a space. Then, as shown in FIG. 6E, heating is performed while pressing the second-stage device 560 and the first-stage semiconductor assembly 550 toward each other. At this point, the second-stage alignment pads 566 again at least partially melt and are further flattened, and the second-stage interconnect bumps 562 (also in an at least partially molten state) subsequently come into contact with the first-stage interconnect pads 512 and form second-stage interconnect solder joints 568.

S680 is similar to S390 described previously. Thus, the description thereof is omitted here.

It is apparent that those skilled in the art can make various changes and modifications to the embodiments of the present application without departing from the spirit and scope of the application. Thus, to the extent that such modifications and variations fall within the scope of the claims and their equivalents, it is intended that the present disclosure encompass such modifications and variations as well.

What is claimed is:

1. A semiconductor packaging method, comprising:
   forming a first stage assembly, including:
      providing at least one first-stage device, at least one second-stage device, a carrier board, and a clamping board, wherein each of the at least one first-stage device respectively has a first-stage first surface and an opposing first-stage second surface, the first-stage first surface is formed with first-stage interconnect pads, the first-stage second surface is formed with first-stage first alignment solder parts, each of the at least one second-stage device respectively has a second-stage first surface, the second-stage first surface is formed with second-stage interconnect terminals and second-stage first alignment solder parts, and the carrier board is formed with first-stage second alignment solder parts respectively corresponding to the first-stage first alignment solder parts, and wherein at least one of the carrier board and the clamping board has at least one opening;
      placing the at least one first-stage device on the carrier board such that the first alignment solder parts are substantially aligned with respective ones of the second alignment solder parts;
      forming alignment solder joints by soldering the first alignment solder parts to respective ones of the second alignment solder parts to align and fix the at least one first-stage device to the carrier board;
      injecting a molding compound through the at least one opening to form a molded package body encapsulating the at least one first-stage device between the carrier board and the clamping board, the clamping board abutting the first-stage first surface of each of the at least one first-stage device;
      removing the clamping board to expose the first-stage first surface of each of the at least one first-stage device;
      sequentially forming an interconnect layer and interposer terminals on a side of the molded package body where the first-stage first surface of each of the at least one first-stage device is exposed, the interposer terminals including respective terminals corresponding to the second-stage interconnect terminals on a respective second-stage device of the at least one second-stage device, wherein at least some of the first-stage interconnect pads of each of the at least one first-stage device are respectively electrically connected to at least some of the interposer terminals, through the interconnect layer; and
      forming second-stage second alignment solder parts corresponding to the second-stage first alignment solder parts, respectively, on the interconnect layer;
   placing the at least one second-stage device over the interconnect layer such that the second-stage first alignment solder parts are substantially aligned with the second-stage second alignment solder parts;
   forming second-stage alignment solder joints by soldering the second-stage first alignment solder parts and the second-stage second alignment solder parts so that the at least one second-stage device is precisely aligned to the first-stage assembly;
   pressing the at least one second-stage device and the first-stage assembly toward each other while the second-stage alignment solder joints are at least partially melted to respectively join the second-stage interconnection terminals and the interposer terminals to form interconnect joints; and
   releasing the pressing.

2. The semiconductor packaging method according to claim 1, wherein the at least one first-stage device and the at least one second-stage device includes at least one of a semiconductor device and an interconnect board, the interconnect board being an interposer or a substrate.

3. The semiconductor packaging method according to claim 1, wherein at least one of the at least one first-stage device and the at least one second-stage device further includes a through electrode.

4. The semiconductor packaging method according to claim 1, wherein a sum of heights of a second-stage interconnect terminal and a corresponding interposer terminal is less than a sum of heights of a second-stage first alignment solder part and a corresponding second-stage second alignment solder part, such that the second-stage interconnect terminals are spaced apart from the interposer terminals after the second-stage first alignment solder parts and the second-stage second alignment solder parts form second-stage alignment solder joints.

5. The semiconductor packaging method according to claim 1, further comprising forming external interconnect terminals on the interconnect layer such that at least some of the first-stage interconnect pads are respectively electrically connected to the external interconnect terminals through the interconnect layer.

6. The semiconductor packaging method according to claim 1, wherein respectively joining the second-stage interconnection terminals and the interposer terminals to form interconnect joints includes, while the at least one second-stage device is in precise alignment with the first-stage assembly and the second-stage alignment solder joints are still in an at least partially molten state, pressing the at least one second-stage device and the first-stage assembly toward each other.

7. The semiconductor packaging method according to claim 6, wherein the plurality of external interconnect terminals are spaced apart from the second level second alignment solder parts so as not to be covered by a perpendicular projection of the at least one second-stage device on the interconnect layer after at least one second-stage device is precisely aligned with the first-stage assembly.

8. The semiconductor packaging method according to claim 1, wherein respectively joining the second-stage interconnection terminals and the interposer terminals to form interconnect joints includes, after the at least one second-stage device is in precise alignment with the first-stage assembly, applying heat to melt the second-stage alignment solder joints again and pressing the at least one second-stage device and the first-stage assembly toward each other when the second-stage alignment solder joints are in a molten or partially molten state.

9. The semiconductor packaging method according to claim 1, wherein:
the second-stage interconnect terminals are interconnect bumps, and the interposer terminals are interposer bumps or interposer pads; or
the second-stage interconnect terminals are interconnect pads and the interposer terminals are interposer bumps.

10. The semiconductor packaging method according to claim 9, wherein:
the interconnect bumps are solder bumps and respectively joining the second-stage interconnect terminals and the interposer terminals includes soldering the second-stage interconnect terminals to respective ones of the interposer terminals to form interconnect joints; or
the interconnect bumps does not include solder and respectively joining the second-stage interconnect terminals and the interposer terminals includes bonding the second-stage interconnect terminals and respective ones of the interposer terminals by thermocompression bonding.

11. A semiconductor packaging method, comprising:
forming a first stage assembly, including:
providing at least one first-stage device, at least one second-stage device, a carrier board, and a clamping board, wherein each of the at least one first-stage device respectively has a first-stage first surface and an opposing first-stage second surface, the first-stage first surface is formed with first-stage interconnect pads, the first-stage second surface is formed with first-stage first alignment solder parts, each of the at least one second-stage device respectively has a second-stage first surface, the second-stage first surface is formed with second-stage interconnect bumps and second-stage first alignment solder parts, the second-stage interconnect bumps respectively corresponding with at least some of the first-stage interconnect pads, and the carrier board is formed with first-stage second alignment solder parts respectively corresponding to the first-stage first alignment solder parts, and wherein at least one of the carrier board and the clamping board has at least one opening;
placing the at least one first-stage device on the carrier board such that the first alignment solder parts are substantially aligned with respective ones of the second alignment solder parts;
forming alignment solder joints by soldering the first alignment solder parts to respective ones of the second alignment solder parts to align and fix the at least one first-stage device to the carrier board;
injecting a molding compound through the at least one opening to form a molded package body encapsulating the at least one first-stage device between the carrier board and the clamping board, the clamping board attached to the first-stage first surface of each of the at least one first-stage device; and
removing the clamping board to expose the first-stage first surface of each of the at least one first-stage device;
placing the at least one second-stage device on the first-stage assembly such that the second-stage first alignment solder parts are substantially aligned with second-stage second alignment solder parts on the first-stage assembly, wherein the second-stage second alignment solder parts are pre-formed on a side of the first-stage assembly where the first-stage first surface is exposed and respectively correspond with the second-stage first alignment solder parts;
forming second-stage alignment solder joints by soldering the second-stage first alignment solder parts and the second-stage second alignment solder parts so that the at least one second-stage device is precisely aligned to the first-stage assembly;
pressing the at least one second-stage device and the first-stage assembly toward each other while the second-stage alignment solder joints are at least partially melted to respectively join the second-stage interconnection bumps and the corresponding first-stage interconnect pads to form interconnect joints; and
releasing the pressing.

12. The semiconductor packaging method according to claim 11, wherein the at least one first-stage device and the at least one second-stage device includes at least one of a semiconductor device and an interconnect board, the interconnect board being a interposer or a substrate.

13. The semiconductor packaging method according to claim 11, wherein at least one of the at least one first-stage device and the at least one second-stage device further includes a through electrode.

14. The semiconductor packaging method according to claim 11, wherein a sum of heights of a second-stage interconnect terminal and a corresponding interposer terminal is less than a sum of heights of a second-stage first alignment solder part and a corresponding second-stage second alignment solder part, such that the second-stage interconnect terminals are spaced apart from the interposer terminals after the second-stage first alignment solder parts and the second-stage second alignment solder parts form second-stage alignment solder joints.

15. The semiconductor packaging method according to claim 11, wherein pressing the at least one second-stage device and the first-stage assembly toward each other includes, while the at least one second-stage device is in precise alignment with the first-stage assembly and the second-stage alignment solder joints are still in an at least partially molten state, pressing the at least one second-stage device and the first-stage assembly toward each other.

16. The semiconductor packaging method according to claim 11, wherein pressing the at least one second-stage device and the first-stage assembly toward each other includes, after the at least one second-stage device is in precise alignment with the first-stage assembly, applying heat to melt the second-stage alignment solder joints again and pressing the at least one second-stage device and the first-stage assembly toward each other when the second-stage alignment solder joints are in a molten or partially molten state.

17. The semiconductor packaging method according to claim 11, wherein the second-stage interconnect bumps are respectively joined with the first stage interconnect pads by soldering the second-stage interconnect bumps to respective ones of the first-stage interconnect pad.

18. The semiconductor packaging method according to claim 11, wherein the second-stage interconnect bumps are respectively joined with the first stage interconnect pads by thermocompression bonding.

19. The semiconductor packaging method of claim 11, wherein the second-stage interconnect bumps and the second-stage first alignment solder parts together serve as second-stage interconnect terminals on the second-stage first surface of the at least one second-stage device, the second-stage interconnect terminals corresponding, respectively, with the first-stage interconnect pads on the at least one first-stage device.

20. The semiconductor packaging method of claim 11, further comprising, after removing the clamping board and before placing the second-stage device on the first-stage assembly, forming the second-stage alignment solder parts on a side of the first-stage assembly where the first-stage first surface is exposed.

\* \* \* \* \*